(12) United States Patent
Olsson

(10) Patent No.: US 8,616,734 B2
(45) Date of Patent: Dec. 31, 2013

(54) LED ILLUMINATION DEVICES AND METHODS

(75) Inventor: Mark S. Olsson, La Jolla, CA (US)

(73) Assignee: Deep Sea Power & Light, Inc., San Diego, CA (US)

( * ) Notice: Subject to any disclaimer, the term of this patent is extended or adjusted under 35 U.S.C. 154(b) by 0 days.

(21) Appl. No.: 13/279,214

(22) Filed: Oct. 21, 2011

(65) Prior Publication Data

US 2012/0268945 A1    Oct. 25, 2012

Related U.S. Application Data

(60) Continuation of application No. 12/573,788, filed on Oct. 5, 2009, now abandoned, which is a division of application No. 12/021,102, filed on Jan. 28, 2008, now abandoned, which is a division of application No. 11/350,627, filed on Feb. 9, 2006, now abandoned.

(60) Provisional application No. 60/652,317, filed on Feb. 10, 2005.

(51) Int. Cl.
*F21V 3/00* (2006.01)
*F21V 5/04* (2006.01)

(52) U.S. Cl.
USPC ............... 362/311.02; 362/311.06; 362/373; 362/335

(58) Field of Classification Search
USPC ............ 362/311.02, 547, 294, 373, 331, 332, 362/335, 318, 311, 326, 268, 257, 311.06, 362/311.1, 249.02; 257/98, 100, 712, 257/717–722
See application file for complete search history.

(56) References Cited

U.S. PATENT DOCUMENTS

| | | | | |
|---|---|---|---|---|
| 3,596,136 A | * | 7/1971 | Fischer | 257/794 |
| 4,727,457 A | * | 2/1988 | Thillays | 362/582 |
| 6,781,209 B1 | * | 8/2004 | Althaus et al. | 257/432 |
| 2004/0012958 A1 | * | 1/2004 | Hashimoto et al. | 362/241 |

* cited by examiner

*Primary Examiner* — Bao Q Truong
(74) *Attorney, Agent, or Firm* — Steven Tietsworth, Esq.

(57) ABSTRACT

Lens elements having a generally curved shape with a flat surface mounted adjacent an LED for improving the light transmission efficiency and the dispersal pattern of radiation emitted by the LED are disclosed.

10 Claims, 22 Drawing Sheets

LED ILLUMINATION DEVICES AND METHODS

CROSS-REFERENCE TO RELATED APPLICATIONS

This application is a Continuation of and claims priority to U.S. Utility patent application Ser. No. 12/573,788, entitled LED ILLUMINATION DEVICE WITH CUBIC ZIRCONIA LENS, filed Oct. 5, 2009 now abandoned, which is a Division of and claims priority to U.S. Utility patent application Ser. No. 12/021,102, entitled LED ILLUMINATION DEVICE WITH CUBIC ZIRCONIA LENS, filed Jan. 28, 2008 now abandoned, which is a Division of and claims priority to U.S. Utility patent application Ser. No. 11/350,627, entitled LED ILLUMINATION DEVICES, filed Feb. 9, 2006 now abandoned, which claims priority to U.S. Provisional Patent Application Ser. No. 60/652,317, entitled LED ILLUMINATION DEVICES WITH HEAT EXTRACTION, filed Feb. 10, 2005. This application claims priority to each of these applications, and the content of each of these applications is hereby incorporated by reference herein in its entirety for all purposes.

FIELD

The present invention relates to lighting, and more particularly, to illumination devices that use light emitting diodes (LEDs) as a source of light.

BACKGROUND

Semiconductor LEDs have replaced conventional incandescent, fluorescent and halogen light sources in many applications due to their small size, reliability, relatively inexpensive cost, long life and compatibility with other solid state devices. In a conventional LED, an N-type gallium arsenide substrate that is properly doped and joined with a P-type anode will emit light in visible and infrared wavelengths under a forward bias. In general, the brightness of the light given off by an LED is contingent upon the number of photons that are released by the recombination of carriers inside the LED. The higher the forward bias voltage, the larger the current and the larger the number of carriers that recombine. Therefore, the brightness of an LED can be increased by increasing the forward voltage. However due to many limitations, including the ability to dissipate heat, conventional LEDs are only capable of producing about six to seven lumens.

Recently a new type of LED has been developed for use as a flash in camera phones. The Luxeon®. Flash LXCL-PWF1 and LXCL-PWF2 LEDs commercially available from Lumileds Lighting of San Jose, Calif., USA are capable of producing forty lumens at one ampere, and eighty lumens at one ampere, respectively. These surface mounted LEDs are only one millimeter in height and they have a very small footprint (2.0 .times. 1.6 mm or 3.2 .times. 1.6 mm, respectively). They are rated for 100,000 flashes at one ampere, and one hundred and sixty-eight hours of DC (flashlight/torch mode) at 350 milliamperes.

While these new flash LEDs offer increased brightness over conventional LEDs they still suffer from problems associated with heat dissipation and inefficient distribution of light.

SUMMARY

In one aspect, this disclosure relates to an illumination device that may include an LED and a lens element with a curved surface positioned opposite a light emitting surface of the LED. A quantity of transparent material may be used to join the lens element and the light emitting surface of the LED.

In another aspect, an illumination device may include at least one LED mounted on a substrate and having an exposed metal heat conduction surface. At least one aperture may be formed in the substrate adjacent to the exposed metal heat conduction surface of the LED and a heat sink may be mounted in the aperture.

In another aspect, a method of fabricating an illumination device may include one or more of the steps of removing a top section of an optically transparent cover of a high intensity LED package and leaving a remaining lower section having a height dimension less than about twice a longest dimension of a light emitting surface of an LED in the LED package. The method may further include the step of mounting a lens element on top of the lower section, the lens element may have a curved surface that faces the light emitting surface of the LED.

Various additional aspects, details, features, and functions are further described below in conjunction with the appended Drawings.

BRIEF DESCRIPTION OF THE DRAWINGS

Throughout the drawing figures, like numerals refer to like parts.

DETAILED DESCRIPTION OF EMBODIMENTS

Overview

Figure 1:
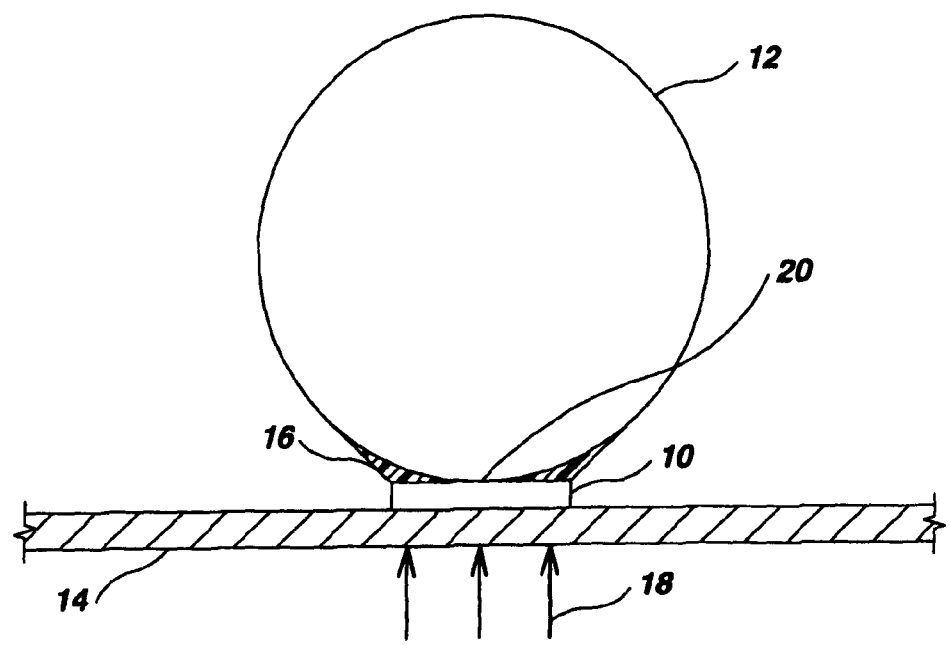
FIG. 1 is a diagrammatic side view of an embodiment of the present invention.

Referring to FIG. 1, a flash LED 10 is surface mounted on a circuit supporting element 14 in the form of a planar printed circuit board (PCB). A flat facet (not visible) of a substantially spherical optically transparent element 12 measuring approximately 3/16 inches in diameter is bonded to the active upper face of the flash LED 10. One suitable commercially available adhesive is transparent, high temperature adhesive designated Loctite 382 (Tak Pak). The flash LED 10 is preferably the previously identified Luxeon® Flash LXCL-PWF1 LED or LXCL-PWF2 LED commercially available from Lumileds Lighting. Further details of these LEDs may be found in the list of issued U.S. patents and pending U.S. patent applications set forth in Appendix A of the aforementioned provisional application, the entire disclosures of which are hereby incorporated by reference. The optically transparent element 12 is preferably made of sapphire. The total light output of the device illustrated in FIG. 1 was found to be approximately fifteen percent greater than the flash LED 10 by itself. It is believed that this increase in total light output is due to improved heat dissipation from the front side of the emitter of the flash LED 10 and the region immediately around the emitter due to the proximity of the sapphire element 12, which is an excellent conductor of heat. Unlike conventional LEDs, the flash LED 10 is not bonded directly to a massive metal substrate so the sapphire element 12 provides alternate means of heat removal from the flash LED 10. In addition, the sapphire element 12 can affect the radiation emitted by the flash LED 10 by focusing the same into a beam.

Besides sapphire, transparent ceramics such as Magnesia (MgO), magnesium aluminate spinel (MgAl2O4), aluminum oxynitride spinel (AlON), cubic zirconia (ZRO2Si), spinel (MgO x Al2O3) and rutile (TiO2) can also be used for the transparent element 12 due to their a high thermal conductivity. It is preferable that the transparent element 12 be made of a material that has at least half or more of the thermal conductivity of sapphire. Sapphire has an additional advantage of having a high index of refraction, such that when element 12 is made of properly shaped sapphire, it can focus the radiation emitted by the flash LED 10 into a highly useful slightly diverging beam Heat transfer is improved by using a body 16 of an optically transparent material to thermally couple the flash LED 10 and the transparent element 12. The body 16 may be transparent fluid, grease, gel or polymer. One suitable material is DOW CORNING® compound 4 (DC 4) which is stable up to four hundred degrees F. (204 C.) which is above the maximum operating temperature of the flash LED 10. Certain fluorocarbon thermal management fluids such as 3M Novec® Engineered Fluids (HFE-7200) or 3M Fluorinert® Electronic Liquids. HFE-7000 has a boiling point of 76 C., which is well below the operating temperature of the flash LED 10. Boiling off of the cooling fluid, on and adjacent to the flash LED 10 can provide significant additional cooling. For additional cooling forced fluid flow and channels can be provided adjacent the flash LED 10. The flash LED 10 and body 16 can be pressed against the base of the transparent element 12 with a spring or using the resilience of the PCB 14, as indicated by the arrows 18.

Figure 2:
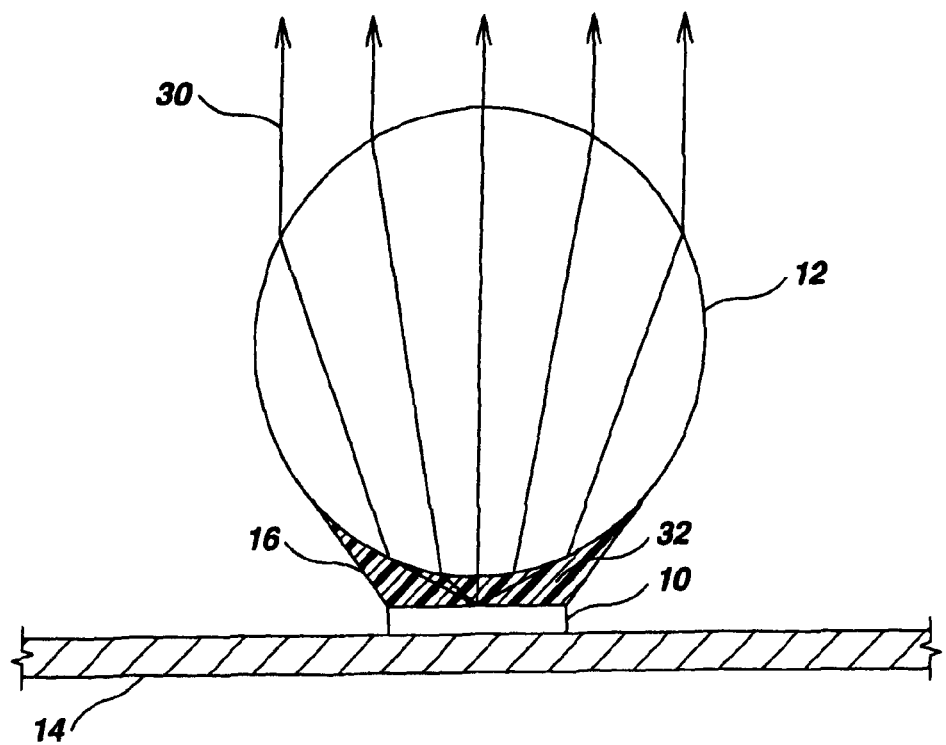
FIG. 2 illustrates the light focusing properties of the embodiment of FIG. 1.

FIG. 2 illustrates the manner in which the generally spherical transparent element 12 forms the radiation emitted by the flash LED 10 into a beam represented by light rays 30. The gap between the face of the flash LED 10 and the underside of the transparent element 12 is filled with a transparent grease or gel 32.

A low melting point metal could also be used as a heat conducting element all around the sides of the flash LED 10. Metals such as bismuth or gallium with a melting point well below the maximum operating temperature of the flash LED 10 can be used. Among these are ten specialty solders commercially available from Indium Corporation of America having melting points below 140 degrees C.

Figure 3:
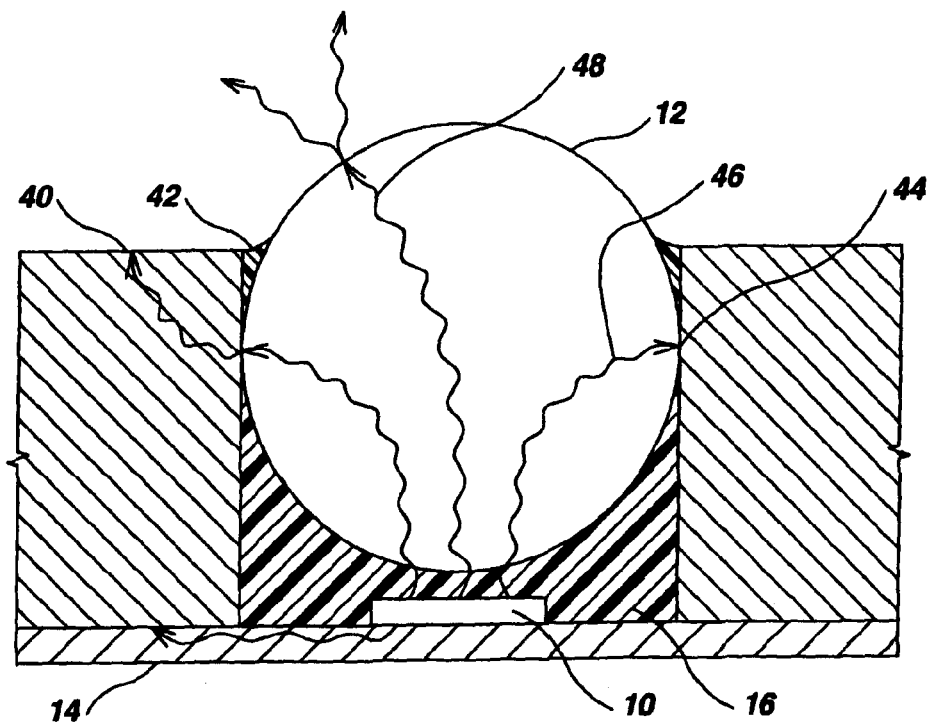
FIG. 3 illustrates another embodiment in which the LED and the transparent element are surrounded by a metal face plate.

Another aspect of the present invention involves press fitting a sapphire sphere or a modified sapphire sphere into a surrounding metal structures. High thermal conductivity metals such as copper, brass, bronze and aluminum are particularly suitable in this application, but other metals such as stainless steel and titanium may suffice in particular environments. A press fit provides an optimal thermal coupling between the sapphire element and the metal structure. The metal structure may be in thermal contact with other structures to provide greater heat sink capabilities. Referring now to FIG. 3, a sapphire sphere 12 is press fit into a cylindrical bore in a metal face plate 40. Optionally, a sealant 42 fills the peripheral gap between the upper side of the sapphire sphere 12 and the upper surface of the face plate 40. At its largest outside diameter 44 the sapphire sphere 12 engages the wall of the bore in the metal faceplate 40, the tolerances being controlled to provide a snug fit. The sapphire sphere 12 is press fit into close proximity with the upper active face of the flash LED 10, but not in contact therewith. The region of the bore in the metal faceplate 40 beneath the sapphire sphere 12 and between the sphere 12 and the flash LED 10 are filled with transparent grease or gel 16. Arrows 46 illustrate the flow of heat from the flash LED 10 into the sapphire sphere 12 and from the sapphire sphere 12 into the surrounding metal face plate 40. Arrows 48 illustrate the flow of heat through the front or upper side of the sapphire sphere 12, which acts as both a heat sink and a lens, into the gas or liquid above the sapphire sphere 12.

Figure 4:
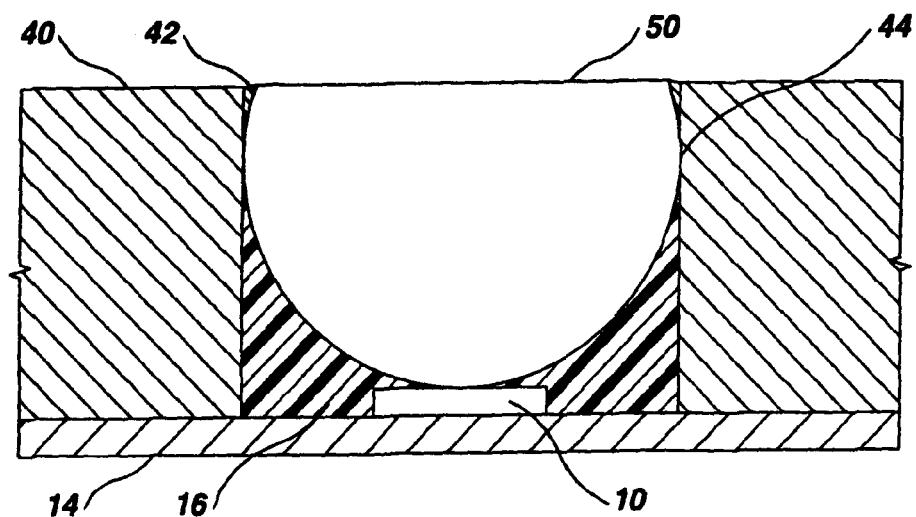
FIG. 4 illustrates another embodiment similar to that of FIG. 3 except that the transparent element is formed as a truncated ball lens.

FIG. 4 illustrates another embodiment similar to that of FIG. 3 except that the transparent element is formed as a truncated ball lens 50. Its upper flat surface forms a wider beam of radiation.

Figure 5:
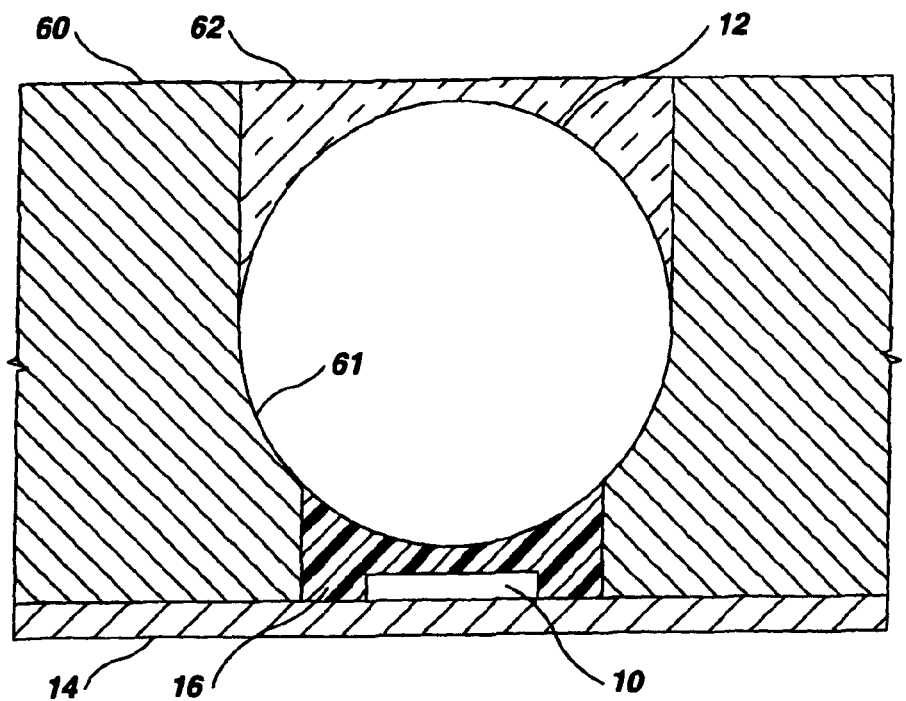
FIG. 5 illustrates another embodiment similar to that of FIG. 3 except that the face plate has a spherical ball support.

FIG. 5 illustrates another embodiment similar to that of FIG. 3 except that the bore in the metal face plate 60 is formed with a curved shoulder 61 that supports the underside of the sapphire sphere 12 in precise position in close proximity to the flash LED 10. Thus a so-called "ball mill plunge cut" in the metal face plate 60 can provide an advantageous mounting for the sapphire sphere 12. The curved shoulder 61 provides a matched radius surface that increases the area of contact between the sapphire sphere 12 and the metal face plate 60. This type of mounting also allows the sapphire sphere 12 to withstand high loads and pressures on the outside face and remain fully supported, as might be encountered in undersea applications. In this embodiment a quantity of a suitable transparent potting material 62 completely covers the upper side of the sapphire sphere 12 and has an upper surface flush with the upper surface of the metal face plate 60. Various other methods can be used to seal the bore, including glues, adhesives, potting compound, rubber gaskets, and elastomeric O-rings.

While press fitting the sapphire sphere has certain advantages, it is not essential to the present invention. Other means for holding the transparent element 12 in place can be used, be they mechanical or adhesive. A thermal shrink fit can also be employed. By way of example only, mounting a sapphire sphere 12 in a bore in an aluminum alloy (7075, 6061 or 6262) or brass alloy (CA 360) with a press fit of about one percent smaller than the diameter of the pressed sphere has produced good results. With softer materials press fits as high as two percent have been successful.

Figure 6:
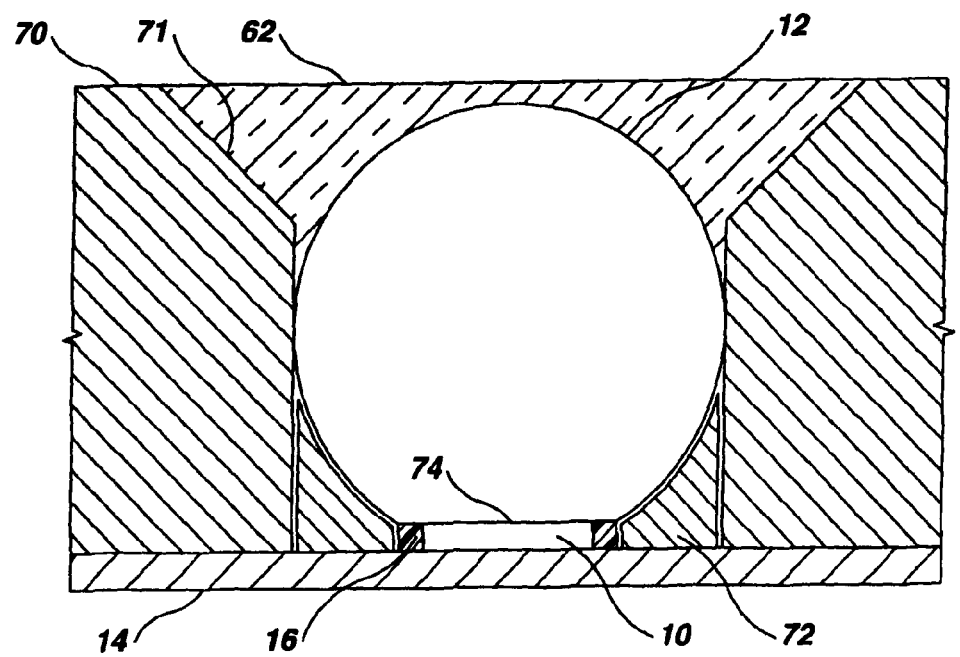
FIG. 6 illustrates another embodiment with reflectors.

FIG. 6 illustrates an alternate embodiment in which metal face plate 70 has a counter-sunk bore, the outwardly tapered part 71 of which forms a reflector. The sapphire sphere 12 is press fit into the lower cylindrical segment of the bore and has a flat underside or facet 74 that is in direct physical contact with the upper active face of the flash LED 10. This maximizes heat extraction. A thermally conductive reflector 72 is inserted into the lower cylindrical part of the bore before the sapphire sphere 12 is inserted.

Figure 7:
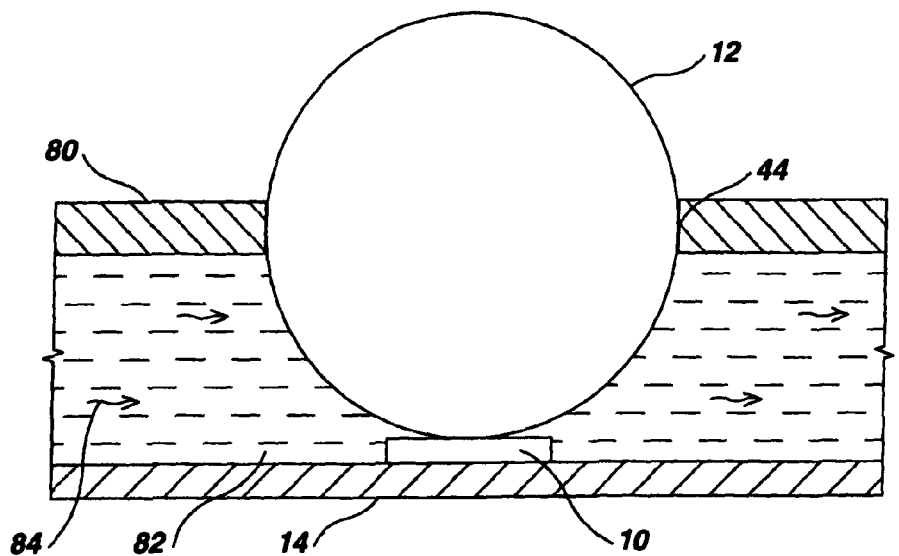
FIG. 7 illustrates another embodiment with a thermal fluid.

In the embodiment of FIG. 7, the sapphire sphere 12 is snugly inserted into a hole in a thin metal face plate 80, and sits on top of the flash LED 10. A thermally conductive fluid 82, preferably with a low viscosity, is circulated via pump means (not illustrated) in a channel or conduit formed between the face plate 80 and the PCB 14. The fluid flows around the sides of the sapphire sphere 12 as indicated by the arrows 84, providing a heat exchanger. The flash LED 10 can be supported on a pair of either separate or insulatively joined posts (not illustrated) to maximize convective or forced flow of cooling fluid past the flash LED 10. The cooling fluid can flow by convection instead of active pumping. The embodiment of FIG. 7 can provide enhanced performance of the flash LED 10 even where the sapphire sphere 12 is eliminated and replaced with a window having minimal heat transfer properties.

Figure 8:
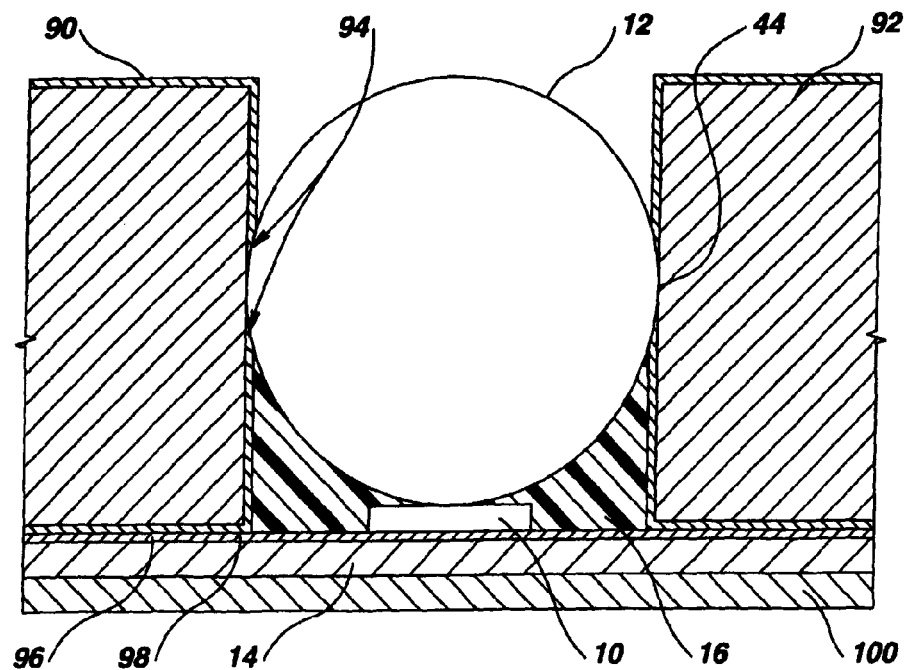
FIG. 8 illustrates another embodiment with an anodized Aluminum face plate.

Referring to FIG. 8, the sapphire sphere 12 is first press fit into a bore in an aluminum face plate 92, which is thereafter anodized to provide protective anodize layers 90. However, importantly there is no anodize layer 90 where the face plate 92 contacts the sapphire sphere 12 to ensure maximum heat transfer. The growth of the anodize layer 90 helps lock the sapphire sphere 12 in position at lock points 94. The face plate 92 is in direct thermal contact with, but electrically insulated from, Copper traces 96 on PCB 14 by direct contact with anodized surface 98. A metal plate 100 backs the PCB 14 to provide further heat transfer. In the preferred embodiment, a hard type III anodize surface is used for greater corrosion resistance, using any of the known sealing methods such as dichromate, nickel acetate and hot water.

A further aspect of the present invention involves the use of the anodized coating as an electrical insulating layer between the conductive traces 96 on the PCB 14 and the anodized aluminum face plate 92. Bare, large surface area conductors can be used on the LED side of the PCB 14 and held in mechanical contact with the insulating surface of the face plate 92 to maximize thermal contact. The anodized layers 90 can be made very thin and therefore provide very good thermal conductors. The thermal grease 16 provides even further heat transfer efficiency. Extra thick copper traces 96 can further enhance heat extraction.

Conventional techniques to remove backside heat from the PCB 14 can also be used in addition to those illustrated. The efficiency and operating life of the flash LED 10 are improved if its operating temperature can be reduced. Conventional techniques include heavy copper traces, metal cores in the PCB 14, the inclusion of thermal vias, thermal fillers (T-Lam), multi-layer PCBs with copper flood planes, and conventional heat sinks.

Figure 9:
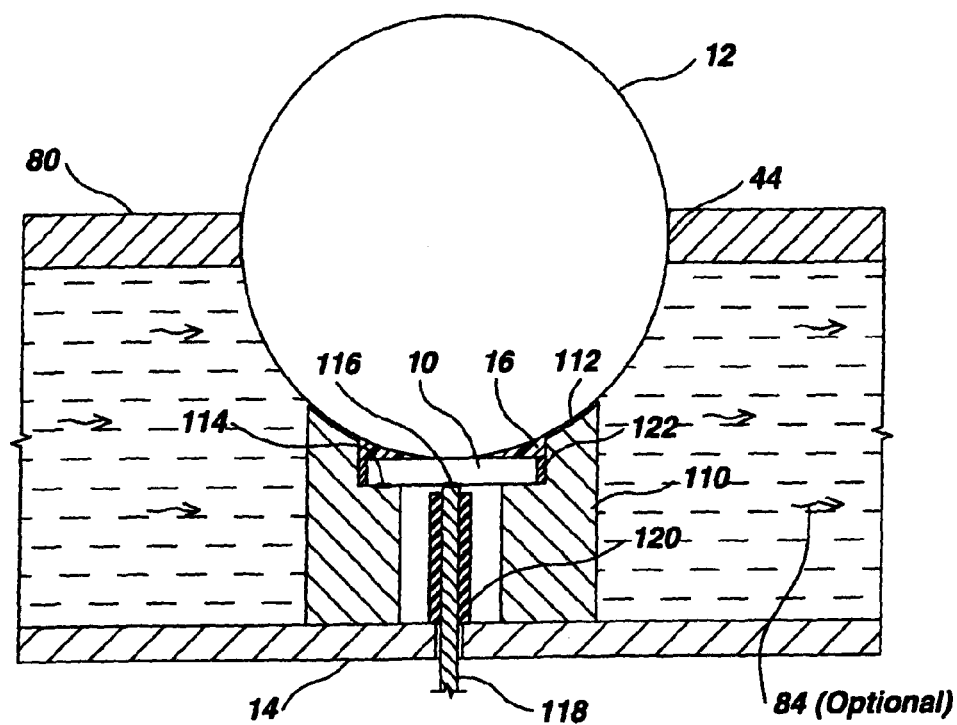
FIG. 9 illustrates another embodiment with a thermal cup.

Referring to FIG. 9, the sapphire sphere 12 is supported on the concave upper reflective surface 112 of a thermal cup 110. The flash LED 10 is mounted in receptacle in the thermal cup 110 and is held via solder joints 114. A wire 118 is held by a solder joint 116 to the underside of the flash LED 10. The wire has an optional insulator jacket 120 and extends through a central hole in the thermal cup 110 and is soldered to the PCB 14. A metal filler 122, which may be low melting point metal or solder, may join the periphery of the flash LED 10 and the walls of the receptacle in the thermal cup 110.

The shape of the beam formed by the transparent element 12 can be adjusted by various means. Where the transparent element 12 is a sapphire sphere and mounted completely or partially in a socket or recess in a front plate such as 80, the region above the transparent element 12 can be filled with a transparent compound. If this compound has a flat outer surface the beam will be spread into a wider, less focused beam. The higher the index of refraction of the potting material, the less focused, and hence the wider the beam will be. Alternately, a polished flat or facet can be ground or otherwise formed on the upper side of the sapphire sphere 12 before installation into the face plate 80. Generally, although not necessarily, the plane of this facet would be parallel with the outer plane of the face plate 80. The facet could be a small area at the apex of the sapphire sphere or a much larger facet if the sapphire is a hemisphere. The larger the area of the facet, the less focused the beam will be. The upper and/or lower surfaces of the transparent element 12 could be frosted by chemical etching or mechanical techniques such as sandblasting to diffuse and soften the beam. The lower apex of the transparent element 12 can be ground or polished to provide a small facet having an area that is approximately the same as the emitter area of the flash LED. In general, it has been found that larger diameter sapphire spheres provide higher optical coupling efficiencies (brighter beams) and smaller sapphire spheres produce more tightly focused beams. It is preferable to remove the reverse voltage protection die on the flash LED 10 in order to achieve maximum thermal coupling.

Over a range of about thirty to forty-five degrees, from the normal (Z-axis) to the face plate 80, the beam can be steered simply by laterally shifting (in X and Y) the position of the flash LED 10 relative to the central axis of the bore in the face plate 80. This results in greater de-focusing and an increasing separation between the sapphire sphere 12 and the flash LED 10. This may impair heat transfer, but this can be offset by introducing a component of Z axis movement in combination with X-Y scanning to keep the flash LED 10 as close as possible to the surface of the sapphire sphere 12.

Figure 10:
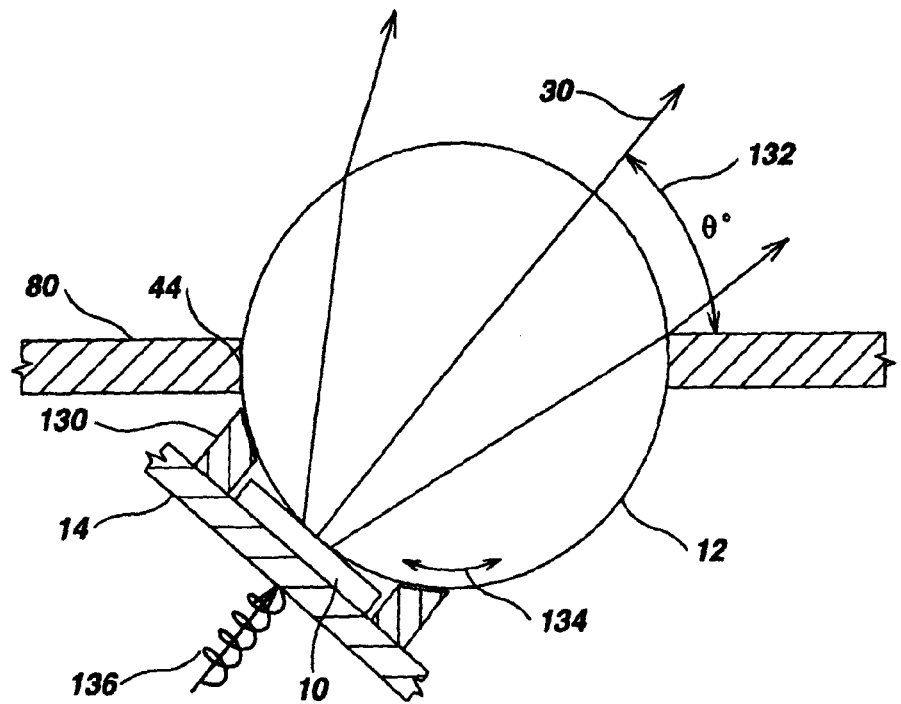
FIG. 10 illustrates another embodiment with a steerable beam.

Referring to FIG. 10, the sapphire sphere 12 is mounted on a thermal reflector cup 130 supported on PCB 14 which is carried by a mechanical pivot (not illustrated). This construction allows the sapphire sphere 12 to swivel inside the bore or socket formed in face plate 80 as indicated by the arrow 134. Tilt angle 132 is the angle between light rays 30 and the plane of the upper surface of the face plate 80, also indicated as theta. A spring 136 biases the sapphire sphere 12 to a predetermined angular orientation.

A pair of oppositely wound, flat spiral springs (not illustrated) can provide compliant mounting force needed to hold the flash LED 10 against the sapphire sphere 12, while at the same time providing an electrical connection to the PCB 14.

A larger sapphire sphere could be combined with a plurality of flash LEDs 10 (not illustrated) mounted in an array on one hemisphere or a section of the hemisphere. The beam projected from each flash LED may or may not overlap the beam from an adjacent LED 10.

RGB arrays of flash LEDs 10 can be employed to allow multi-colored beams to be produced. While presently only available in white, it is anticipated that flash LEDs of the type identified herein will be available that emit light in various colors. The phosphor coating on the commercially available flash LED 10 can be removed after SMT to PCB to produce a blue light emitting device.

Figure 11:
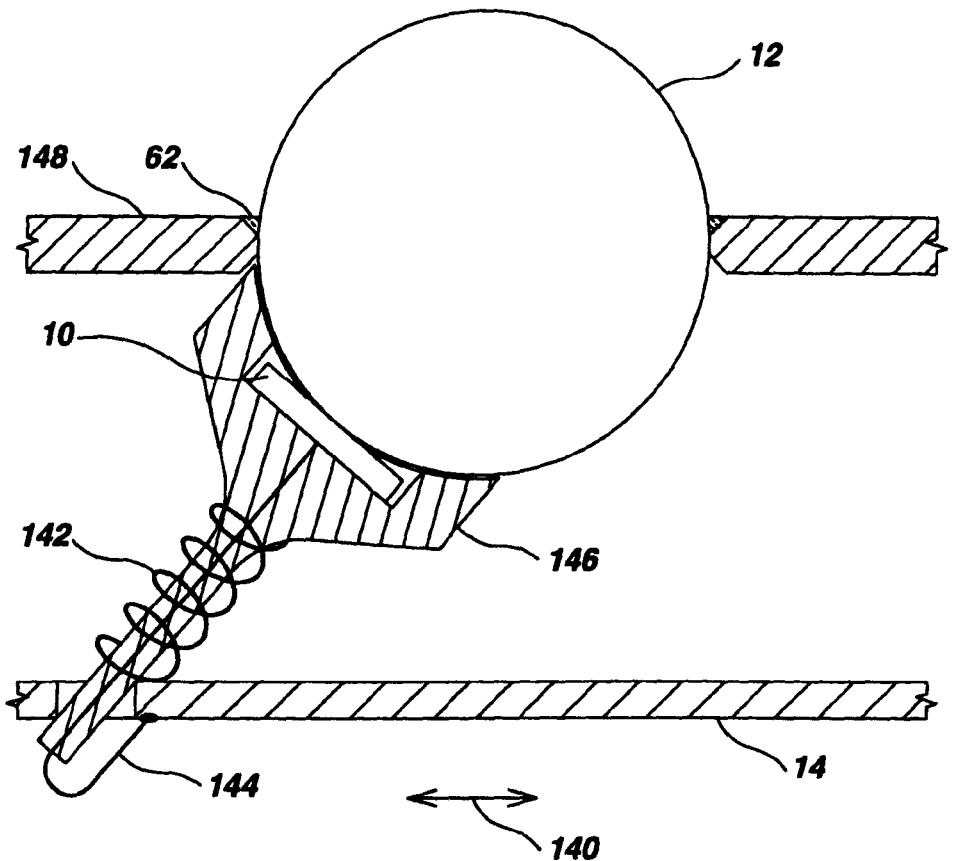
FIG. 11 illustrates an alternate embodiment with a steerable beam.

Referring to FIG. 11, the sapphire sphere 12 is supported on the upper end of a thermal cup 146, whose hollow post is received in a hole in the PCB 14 that is slidable transversely as indicated by arrows 140. A spring 142 surrounding the post biases the sapphire sphere 12 against the walls of the hole in the face plate 148. A wire 144 connects to the flash LED 10 and extends through the center of the post so that its other end can be connected to the PCB 14.

Figure 12:
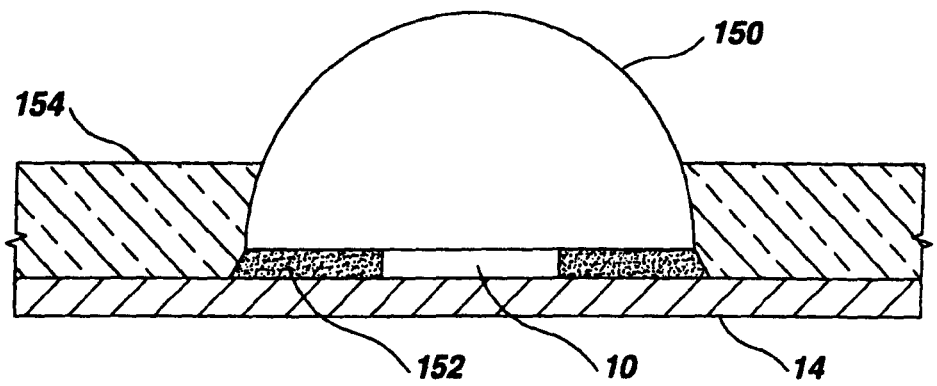
FIG. 12 illustrates another embodiment with a hemispherical lens.

Referring to FIG. 12, an embodiment is illustrated in which a hemispherical transparent element 150, which may be made of sapphire, is bonded on top of the flash LED 10 and the PCB 14 via adhesive 152. A layer of potting compound 154 surrounds the transparent element 152, further solidifying the position and attachment of the transparent element 150 to the PCB 14.

Figure 13:
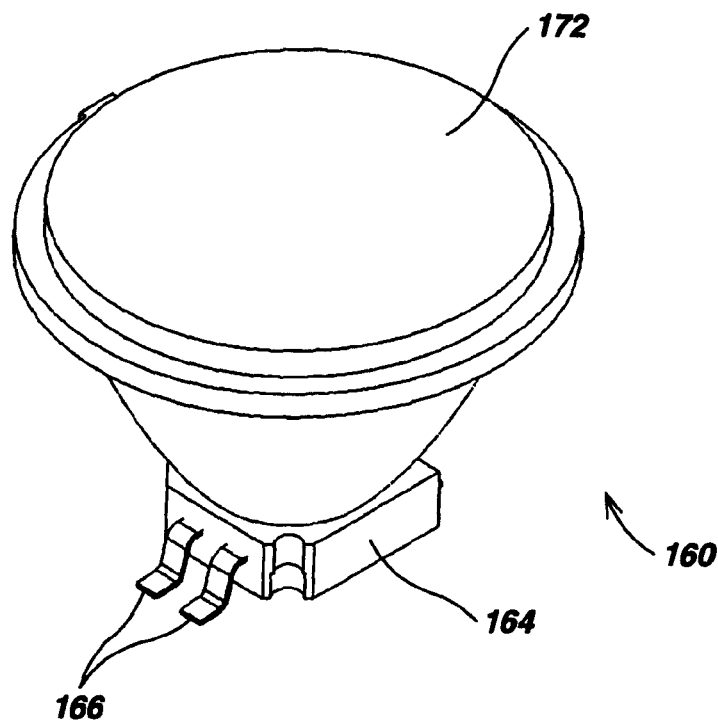
FIG. 13 is an isometric view of a prior art LED and lens assembly.
Figure 14:
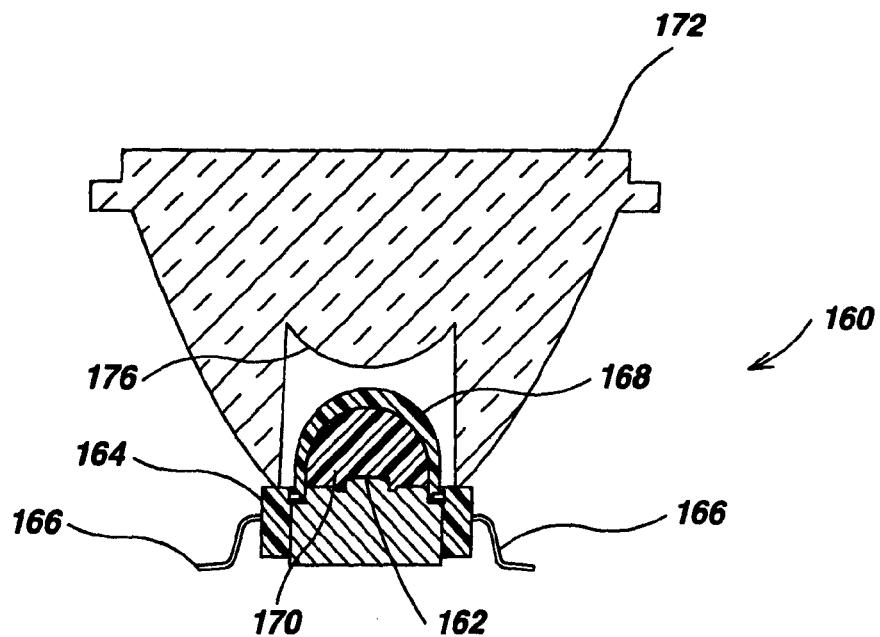
FIG. 14 is a vertical sectional view through the prior art LED and lens assembly of FIG. 13.

FIGS. 13 and 14 illustrate a commercially available high intensity LED and lens assembly 160 available in the United States from Lumileds Lighting US, LLC under the designation LUXEON® K2. The LED 162 (FIG. 14) is mounted on top of a small block portion 164 that supports leads 166. The LED is enclosed in a somewhat rigid, but still pliant, transparent dome-like cover 168 made of silicone rubber (FIG. 14). A quantity 170 of a transparent silicone gel encases the LED 162 and is constrained within the cover 168. A solid frusto-conical lens 172 fits over the cover 168. A central passage 174 in the lens 162 forms a convex lens 176 which is used for beam formation.

Figure 22:
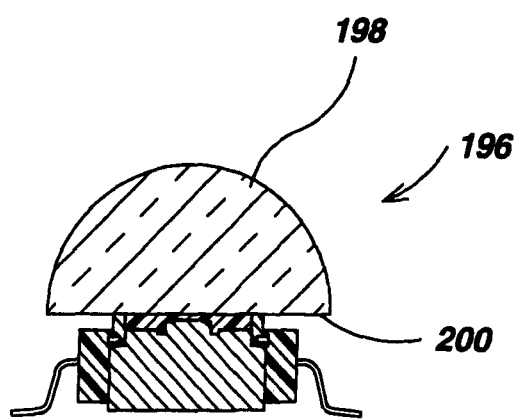
FIG. 22 is a vertical sectional view of the embodiment of FIG. 21.
Figure 23:
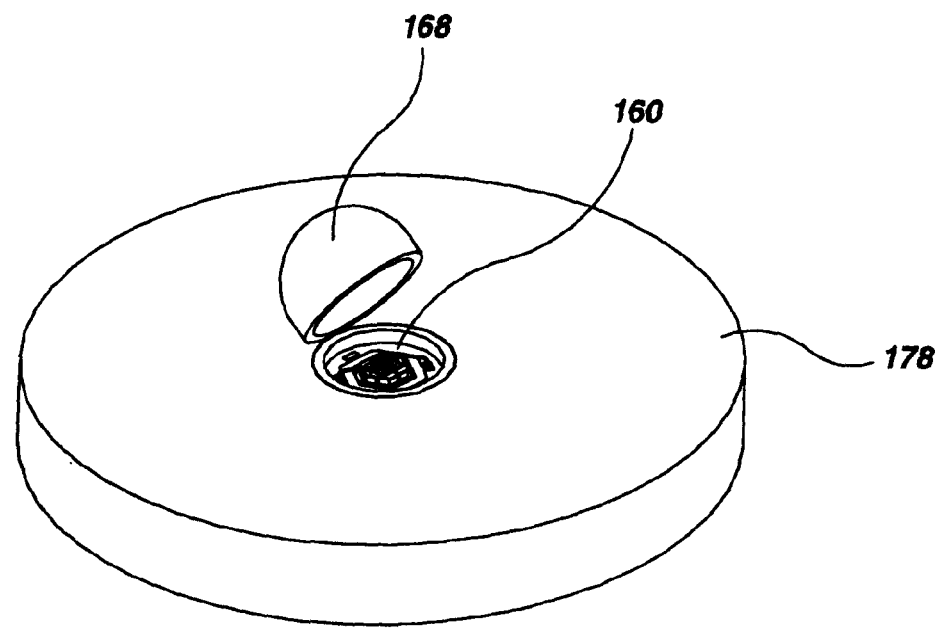
FIG. 23 is an isometric view illustrating the manner in which a portion of a commercially available high intensity LED assembly may be removed.
Figure 24:
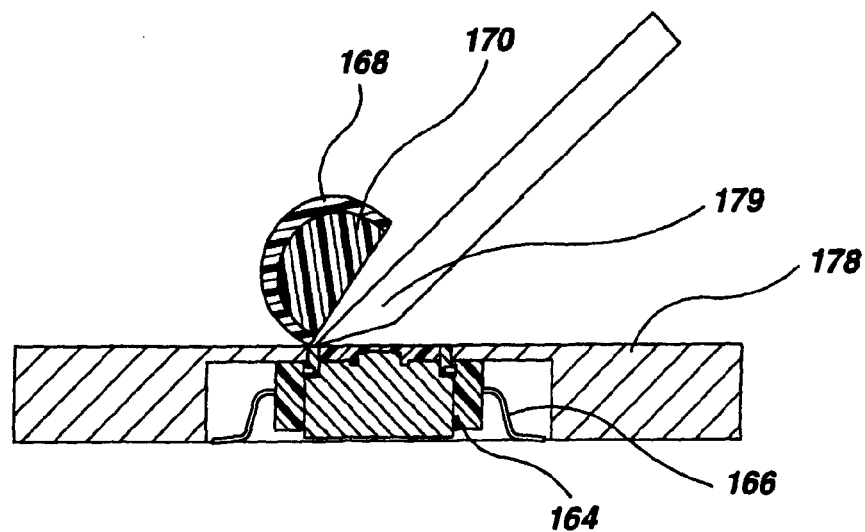
FIG. 24 is a vertical sectional view illustrating the removal of a part of a commercially available high intensity LED with a blade.

Referring to FIGS. 23 and 24, the high intensity LED and lens assembly 160, without the lens 172, can be placed in a pocket 176 (FIG. 24) formed in the underside of a holder 178 which allows the cover 168 to project through a central circular aperture. A sharp blade 179 may then be used to cut off the upper section of the cover 168, without damaging the underlying LED 162. Other techniques for safely removing the cover 168 without damaging the LED 162 will occur to those skilled in the art, such as laser trimming, water jet cutting, hot wire cutting, and slicing. Once the upper section of the cover 168 has been removed, the remaining portion of the LED and lens assembly 160 can be used to construct the LED and lens assemblies illustrated in FIGS. 15-22.

Figure 15:
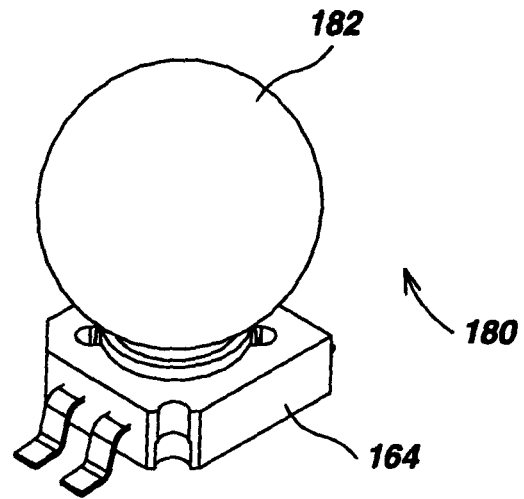
FIG. 15 is an isometric view of an LED and spherical lens assembly in accordance with another embodiment of the present invention.
Figure 16:
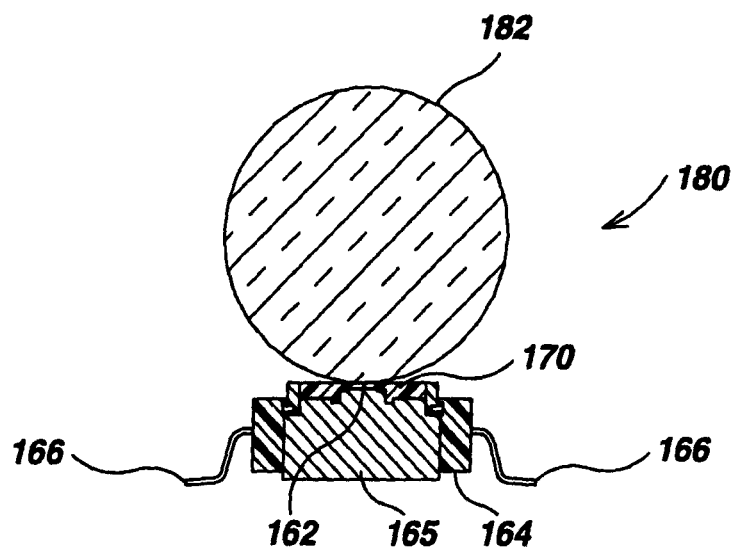
FIG. 16 is a vertical sectional view through the LED and spherical lens assembly of FIG. 15.
Figure 17:
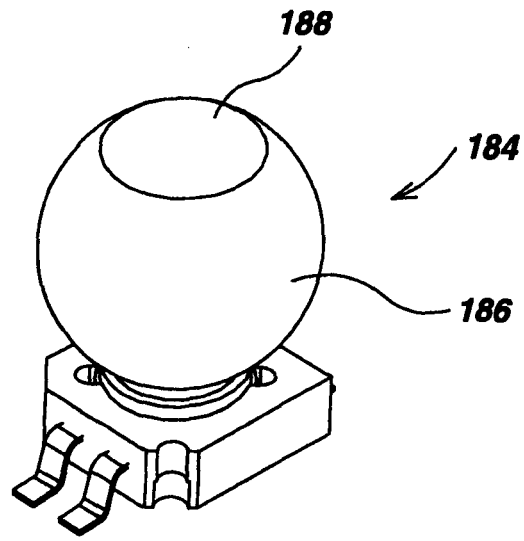
FIG. 17 is an isometric view of another embodiment of the present invention similar to FIG. 15 in which the top of the spherical lens has been truncated.
Figure 18:
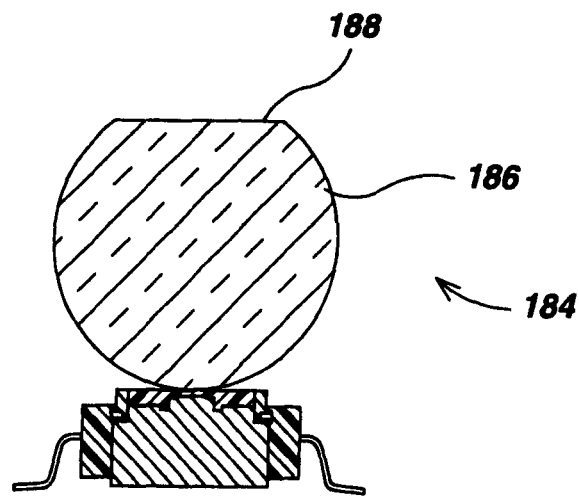
FIG. 18 is a vertical sectional view of the embodiment of FIG. 17.
Figure 19:
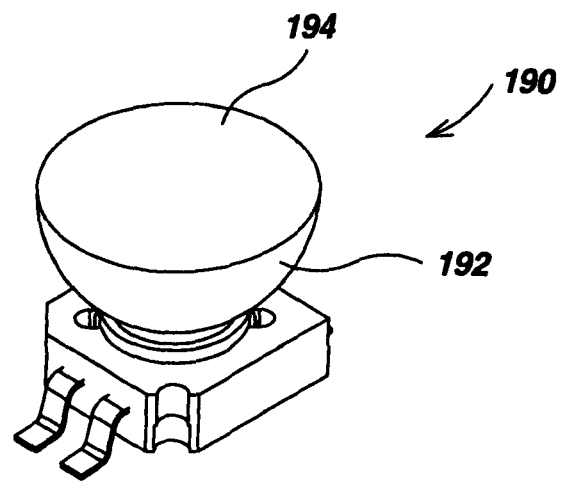
FIG. 19 is an isometric view of another embodiment of the present invention in which the lens comprises half of a sphere, with a flat surface facing upwardly.
Figure 20:
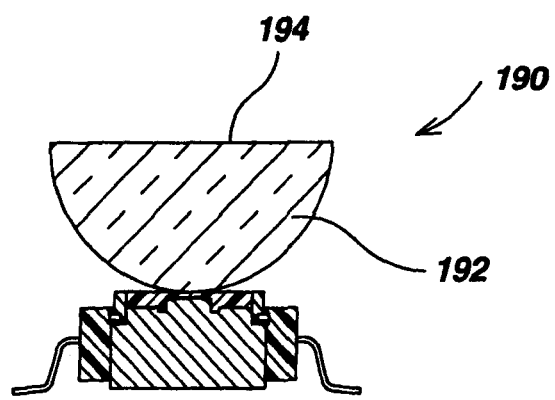
FIG. 20 is a vertical sectional view through the embodiment of FIG. 19.
Figure 21:
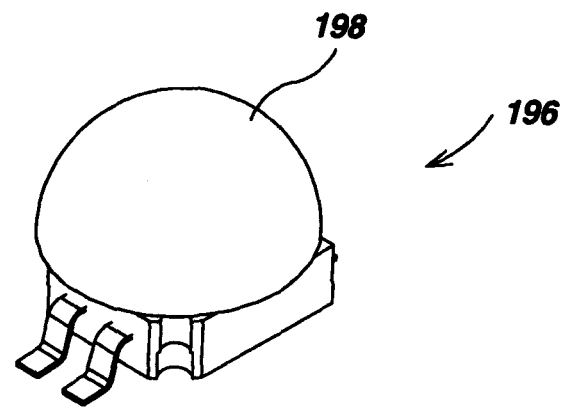
FIG. 21 is an isometric view of another embodiment in which the lens comprises half of a sphere, with the flat surface facing downwardly.

The embodiment 180 of FIGS. 15 and 16 utilizes a spherical sapphire lens element 182 which can be held in position above the LED 162 the remaining lower section of the cover 168. The remaining portion of the transparent liquid gel 170 provides a thermal and optical interface between the LED 162 and the spherical lens element 182. Referring to FIGS. 17 and 18, the embodiment 184 is similar to the embodiment of FIGS. 15 and 16, except that in the embodiment 184 a truncated, spherical sapphire lens element 186 is utilized. The lens element 186 has an upwardly facing facet 188. Referring to FIGS. 19 and 20, another embodiment 190 has a hemispherical sapphire lens element 192 with an upwardly facing facet 194. Referring to FIGS. 21 and 22, another embodiment 196 has a hemispherical sapphire lens element 198 with a downwardly facing facet 200 (FIG. 22).

The high intensity LED and lens assemblies of FIGS. 15-22 provide enhanced heat dissipation from the upper side of the LED 162. Furthermore, the sapphire lens element in each of these embodiments provides improved beam patterns, particularly when these high intensity LED and lens assemblies are immersed in a fluid such as water. This makes them particularly suited for underwater applications. The gel 170 must be a thermally conductive, transparent material with suitable viscosity. However, this material must not change color in the presence of high temperatures, such as 180 .degree. Centigrade. Silicone gel or grease has been found to be particularly suited for providing the thermal and optical interface between the LED 162 and the sapphire lens element.

The spherical lens element may also be made of Cubic Zirconia with a high index of refraction, such as N=2.17. Whereas a spherical sapphire lens may create some secondary rings of light in the beam outside of the main central focus, the beam produced by a spherical lens element made of high index of refraction Cubic Zirconia is much cleaner. The Cubic Zirconia spherical lens element produces a high efficiency beam of light with superior control. More particularly, the use of such a Cubic Zirconia spherical lens element with a high lumen LED produces a focused convergent beam that allows one to easily add a molded plastic optic to collimate or diverge the beam to essentially any beam angle from a narrow spot to a wide flood.

Regardless of what material the spherical lens element is made of, preferably the surface of the spherical lens element is mounted adjacent the light emitting surface of the LED no further than twice the longest dimension of the light emitting surface. In addition, the spherical lens element should have an index of refraction relative to the light emitted by the high lumen LED greater than about 1.65. Moreover, excellent results can be achieved by using a spherical lens element having a diameter D greater than about three times the longest dimension of the light emitting surface. The light path optical space between the spherical lens element and the light emitting surface of the adjacent high lumen LED is preferably filled with an intervening optically transparent material selected from the group consisting of fluid, gel, elastomer or rubber-like material, having an index of refraction less than about 1.50.

A high index of refraction lens element material is particularly suited for underwater lighting applications using LED light sources, where, for example, N should be greater than about 1.6. When a spherical lens element is submerged in a fluid or plotting compound its refractive power is greatly reduced and therefore, the spherical lens element should be made of a material having a much higher index of refraction. A high index of refraction material is needed when a rear or lower side of a spherical lens element is pressed against silicone gel or other interface material covering the face of the LED.

Figure 25:
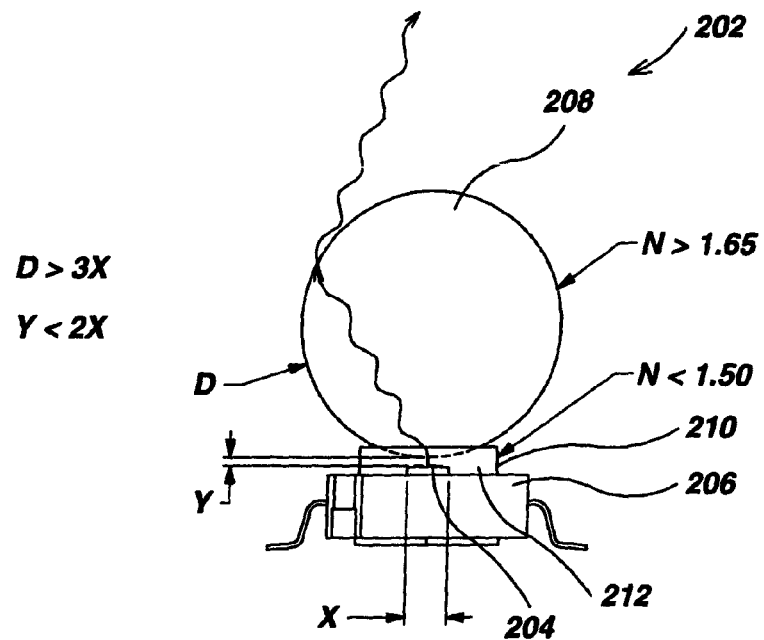
FIG. 25 is a side-elevation view illustrating the dimensional relationships of another embodiment of the present invention that employs a spherical lens element.

Referring to FIG. 25, another embodiment of an LED illumination device 202 utilizes a LEXEON LED 204 including a block portion 206. A generally spherical lens element 208 is supported on top of the remaining section 210 of the dome-shaped cover resulting from the fabrication process illustrated in FIGS. 23 and 24. The spherical lens element 208 is preferably made of Cubic Zirconia having an index of refraction which is greater than about 1.65. A quantity of an intervening optically transparent incompressible material 212 joins an upper light emitting surface of the LED 204 with the underside of the spherical lens element 208.

This optically transparent material is preferably selected from the group consisting of fluid, gel, elastomer or other rubber-like material, and preferably has an index of refraction of less than about 1.50. Where the illumination device 202 is fabricated in accordance with the process illustrated in FIGS. 23 and 24, the intervening optically transparent material 212 is silicone gel which is suitable for high temperature applications, i.e., 180 .degree. Centigrade or higher, because it does not discolor. Furthermore, silicone gel has desirable optical transmission characteristics. In addition, the intervening optically transparent material 212 helps draw heat from the LED 204 to the spherical lens element 208 for dissipation therefrom. The spherical lens element 208 could also be made of Zircon, Sapphire or SF8 Optical Glass. The spacing or distance Y between the spherical lens element 208 and the light emitting surface of the LED 204 is important in determining the efficiency in gathering of light from the LED 204. Preferably, the distance Y is less than twice the longest dimension of the light emitting surface of the LED 204. In addition, the diameter of the spherical lens element 208 is also important in terms of the efficiency of dissemination of light from the LED 204. Preferably, the diameter should be greater than about three time the longest dimension of the light emitting surface of the LED 204. In actual devices constructed with LUXEON LEDs a suitable diameter is about 9.5 millimeters. A second optical element such as lens 260 (FIG. 32) can be mounted adjacent the spherical lens element 208 to form a collimated beam. Lens 260 can be molded out of acrylic or other suitable material. The second optical element can take a wide variety of configurations, as is well known to those skilled in optics, depending on the beam pattern desired.

Figure 26:
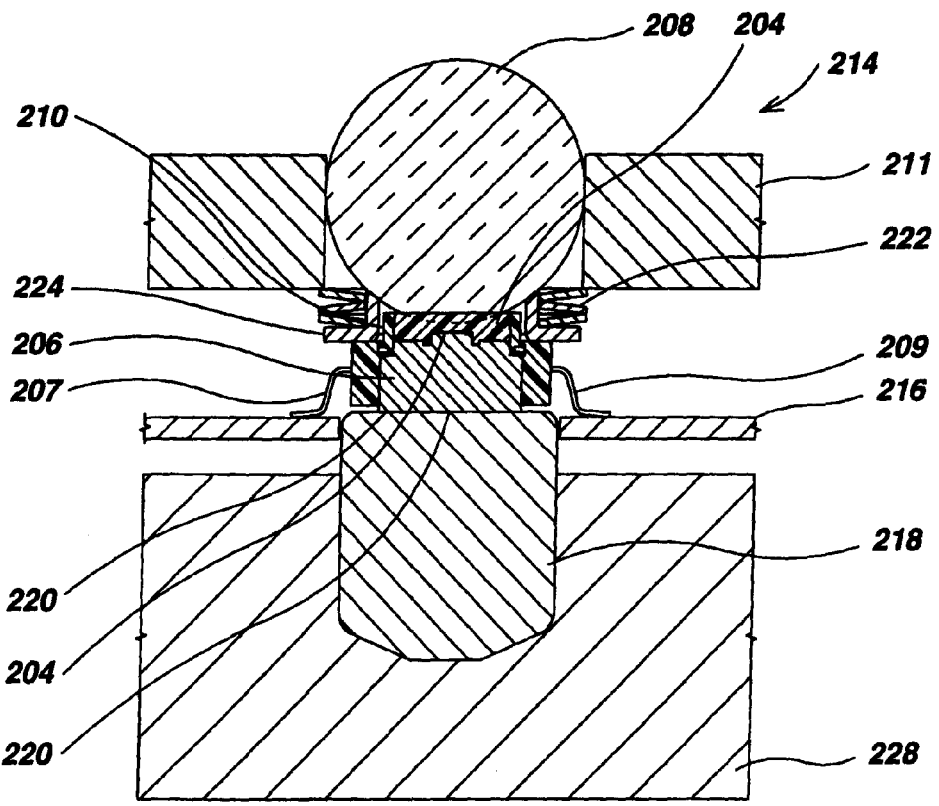
FIG. 26 is a vertical sectional view through another embodiment of the present invention similar to the embodiment of FIG. 25 and in addition, employing heat sinks.
Figure 27:
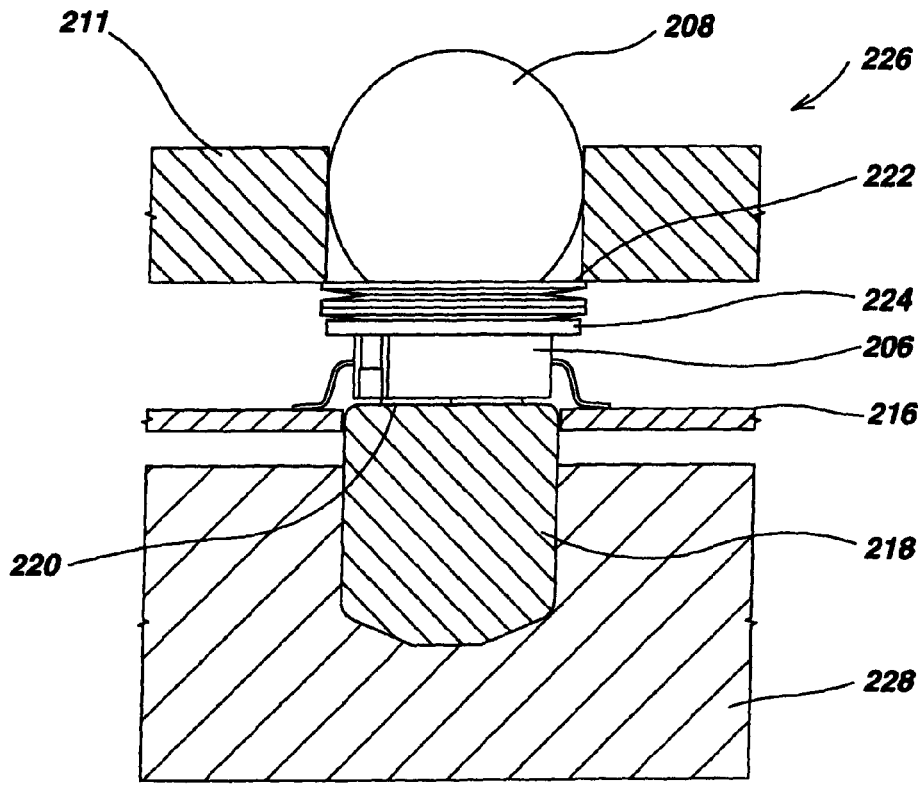
FIG. 27 is a part vertical section, part side elevation view of the embodiment of FIG. 26.

Referring to FIGS. 26 and 27, another embodiment of an LED illumination device 214 includes a substrate 216 such as a printed circuit board, ceramic substrate, polyamide substrate, etc., with at least one aperture formed therein through which a metal heat sink 218 extends. The metal heat sink 218 contacts an exposed metal heat conduction surface 220 on the underside of block portion 206. One or more metal disc springs 222 are compressed between a lens retaining plate 211 and a cylindrical collar 224. The collar 224 is compressed against block portion 206 to maintain the heat conduction surface 220 in contact with heat sink 218. Any known means such as machine screws maybe used to load plate 211 against the disc springs 222. The heat sink 218 may be made of insulating anodized Aluminum, Copper, Copper alloy or insulated Copper alloy. The LUXEON K2 LEDs require that heat sink surface 220 be electrically insulated from LED connections 207 and 209 as well as any other adjacent LEDs in the array. The insulation on the Copper alloy may take the form of a diamond film. The disc springs 222 and collar 224 provide a mechanism that clamps the heat conduction surface 220 against the heat sink 218 to ensure that the maximum amount of heat is dissipated from the LED 204. The heat sink 218 may take the form of an anodized Aluminum pin press fit into a larger planar heat sink 228 through a suitably sized clearance aperture in the substrate 216. Preferably, the disc springs 222 are made of Beryllium Copper. The insulation barrier may be formed by an anodized layer on the sides and bottom of pin 218 allowing the top of pin 218 that is in contact with surface 220 to be bare Aluminum for improved heat conduction. Similarly, an insulating layer on the sides and bottom of a Copper pin may be used and thermal conduction surface 220 may be soldered to the top of the Copper pin.

The substrate 216 (FIGS. 26 and 27) can support multiple surface mounted LEDs each having their own associated spherical lens elements 208 and heat sink pins 218 extending through corresponding apertures in the substrate 216. Each of these multiple heat sink pins 218 can be press fit into a corresponding socket in the larger underlying heat sink 228.

Figure 28:
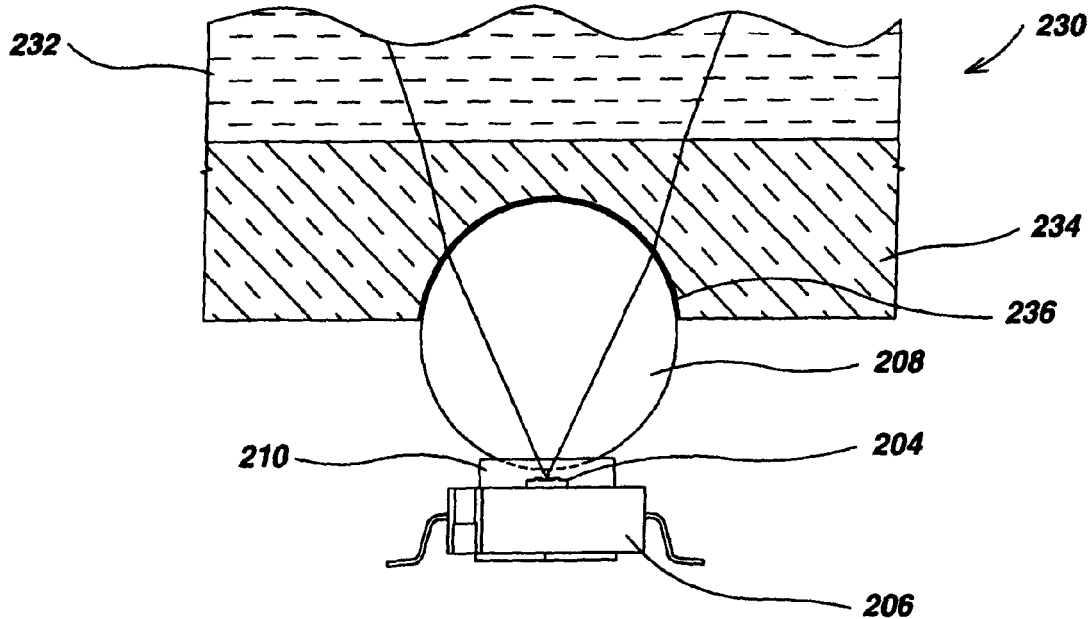
FIG. 28 is a part vertical section, part side elevation view illustrating another embodiment of the present invention particularly suited for underwater use.

Referring to FIG. 28, another embodiment of an LED illumination device 230 is specially adapted for immersion in a body 232 of fresh water or salt water. The spherical lens element 208 is mounted in an hemispherical socket of an acrylic window 234. The window 234 preferably has an index of refraction greater than about 1.20. An intervening optically transparent material such as silicon gel 236 joins the upper surface of the spherical lens element 208 to the walls of the hemispherical socket in the window 234. Instead of water or seawater 232, the fluid in which the embodiment 230 is immersed could comprise other optically transparent liquids such as mineral oil, Fluorinert™ fluid manufactured by 3M, or Novec™ fluid manufactured by 3M. The refraction of light from the LED 204 by the various optical elements and media is illustrated diagrammatically in FIG. 28 by a pair of light rays.

Figure 29:
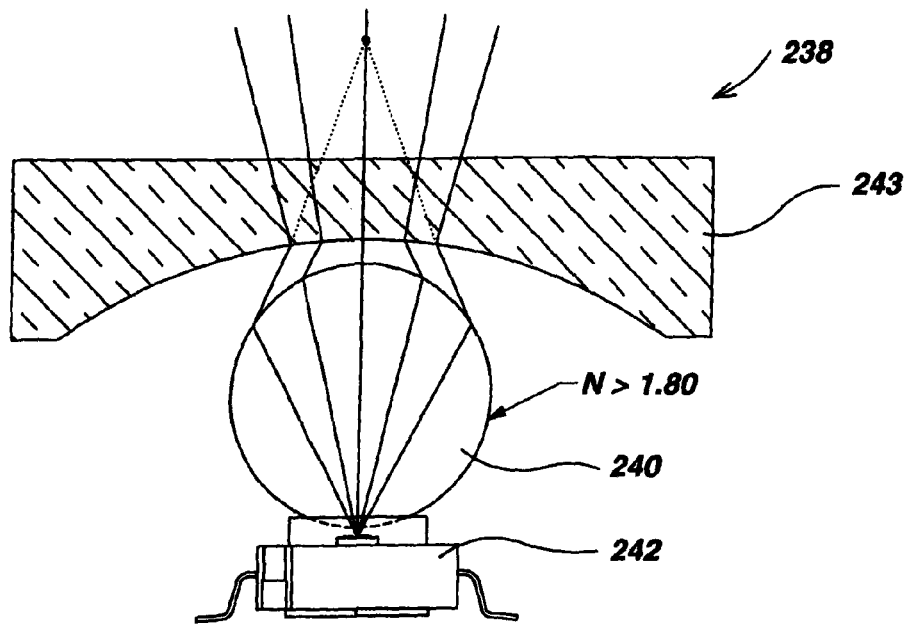
FIG. 29 is a part vertical section, part side elevation view of another embodiment of the present invention employing a diverging optical element having a negative focal length.

Referring to FIG. 29, another embodiment of an LED illumination device 238 has a spherical lens element 240 preferably made of Cubic Zirconia and arranged with a modified Luxeon LED package 242 fabricated in accordance with FIGS. 23 and 24, along with a second optical element 243. The second optical element 243 has a negative focal length in order to form the light into a light beam with a predetermined pattern as indicated diagrammatically in FIG. 29 by the light rays. The negative focal length optical element may have a cylindrical component to change an aspect ratio of the light beam. Preferably, the spherical lens element 240 has an index of refraction greater than about 1.80. It is also possible to have a plurality of different optical elements in front of a single spherical lens element 240, or in front of a plurality of spherical lens elements 240 each having their own associated LED packages 242. The space between lens element 240 and second optical element 243 may be filled with a transparent fluid, gel, grease or potting compound (not shown), to improve optical coupling and provide further refractive control of the output light beam.

Figure 30:
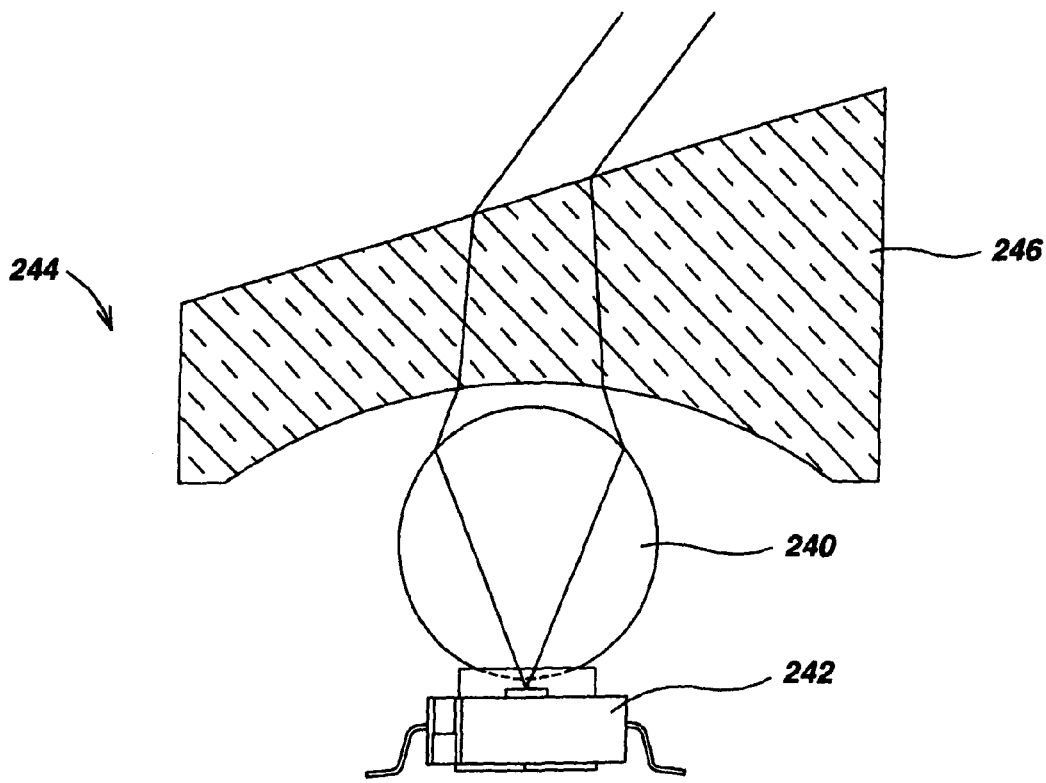
FIG. 30 is a part vertical section, part side elevation view of another embodiment of the present invention employing a second optical element in the form of a prismatic lens.

Referring to FIG. 30, another embodiment of an illumination device 244 is similar to embodiment 238, except that the former employs a prismatic lens element 246 for bending the light as indicated diagrammatically in FIG. 30 by the light rays. The embodiment 244 is particularly suited for use in automobile headlight assemblies. The light is re-directed from the LED 242 off of the vertical axis extending through the spherical lens element 240.

Figure 31:
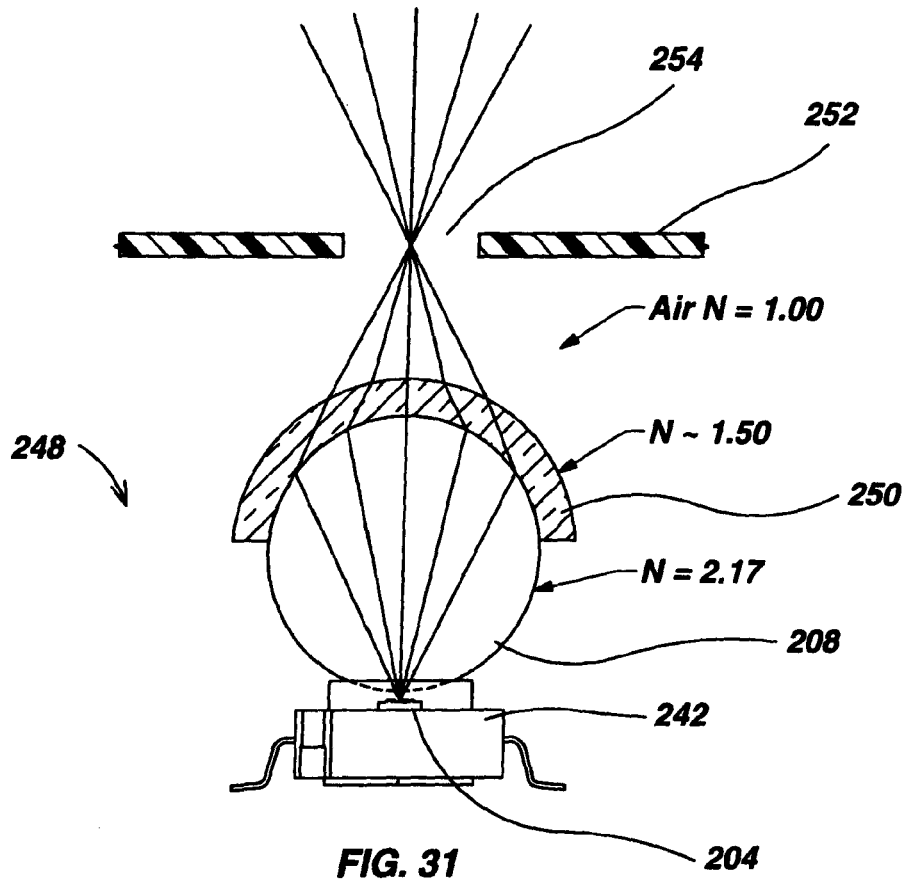
FIG. 31 is a part vertical section, part side elevation view of another embodiment of the present invention suited for a hidden flush mount application.

Referring to FIG. 31, another embodiment of an LED illumination device 248 is designed to provide nearly hidden flush mount light sources. The spherical lens element 208 preferably has, again, an index of refraction of greater than about 1.80 to converge the light to a focus. A hemispherical second optical element 250 fits on top of the spherical optical element 208. Planar member 252 is placed above the hemispherical optical element 250 leaving an air gap having an index of refraction of about 1.00. Light emitted by LED 204 is collected by the spherical lens element 208 and focused by the optical element 250 through a pin hole aperture 254 in the planar member 252. The embodiment 248 is particularly suited for ceiling lighting, security lighting, illuminating wall art, etc. Element 250 serves to prevent total internal reflect (TIR) of the light exiting element 208. TIR light trapping inside the spherical lens element 208 can reduce the light transfer efficiency of the LED lighting system.

Figure 32:
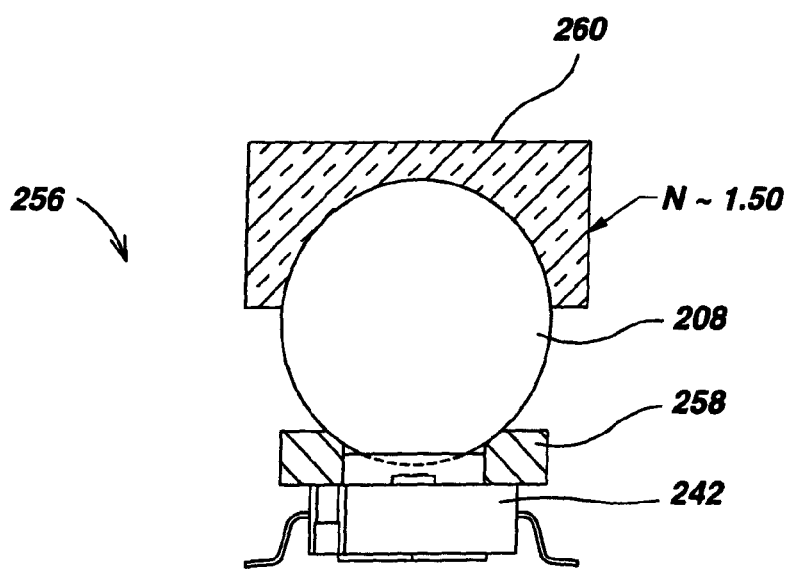
FIG. 32 is a part vertical section, part side elevation view of another embodiment of the present invention with a second optical element having a hemispherical socket for receiving a spherical lens element.

Referring to FIG. 32, another embodiment of an LED illumination device 256 includes a metal sleeve or spacer 258 between the LED device 242 and the spherical lens element 208. The inside circular wall of the sleeve 258 is reflectorized with suitable material (not illustrated) to reduce light loss. A second optical element 260 in the form of a circular or rectangular plastic lens has a hemispherical socket in optical contact with the spherical lens element 208. The second optical element 260 is made of a suitable material having an index of refraction of greater than about 1.50.

Figure 33:
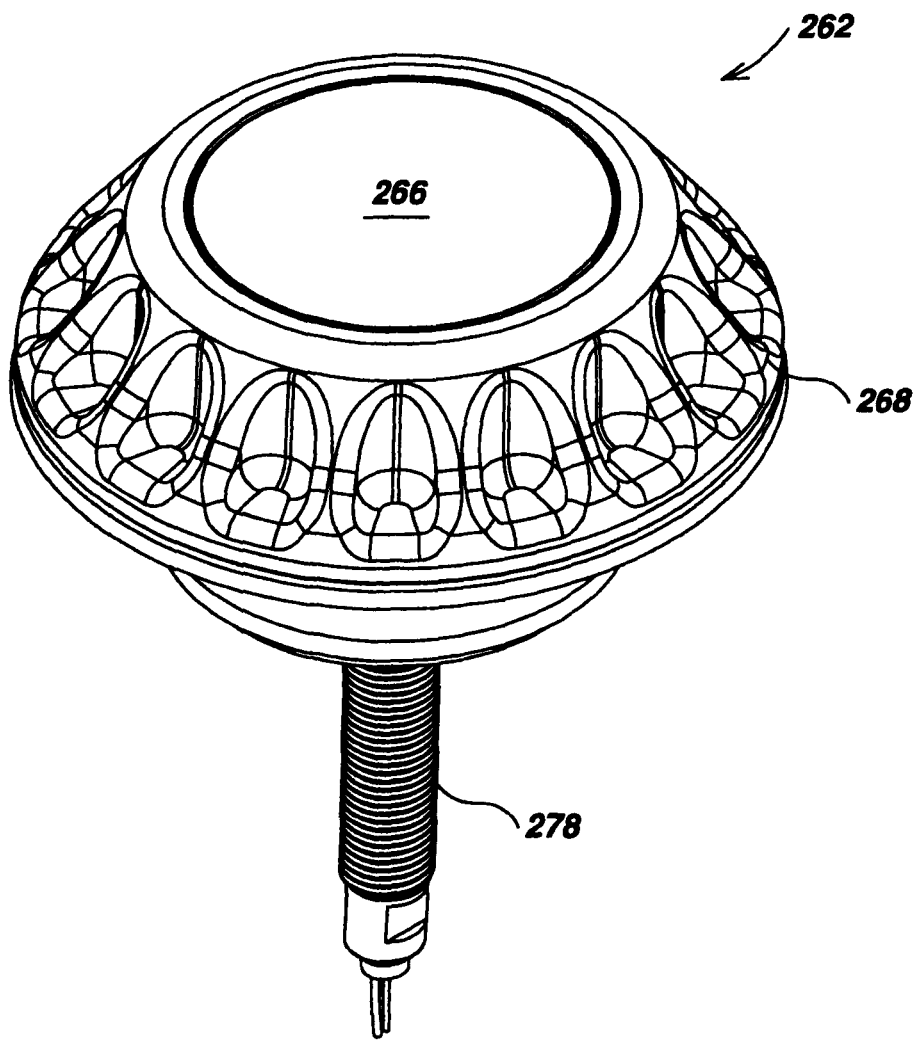
FIG. 33 is an isometric view of a thru-hull light constructed in accordance with the present invention.
Figure 34:
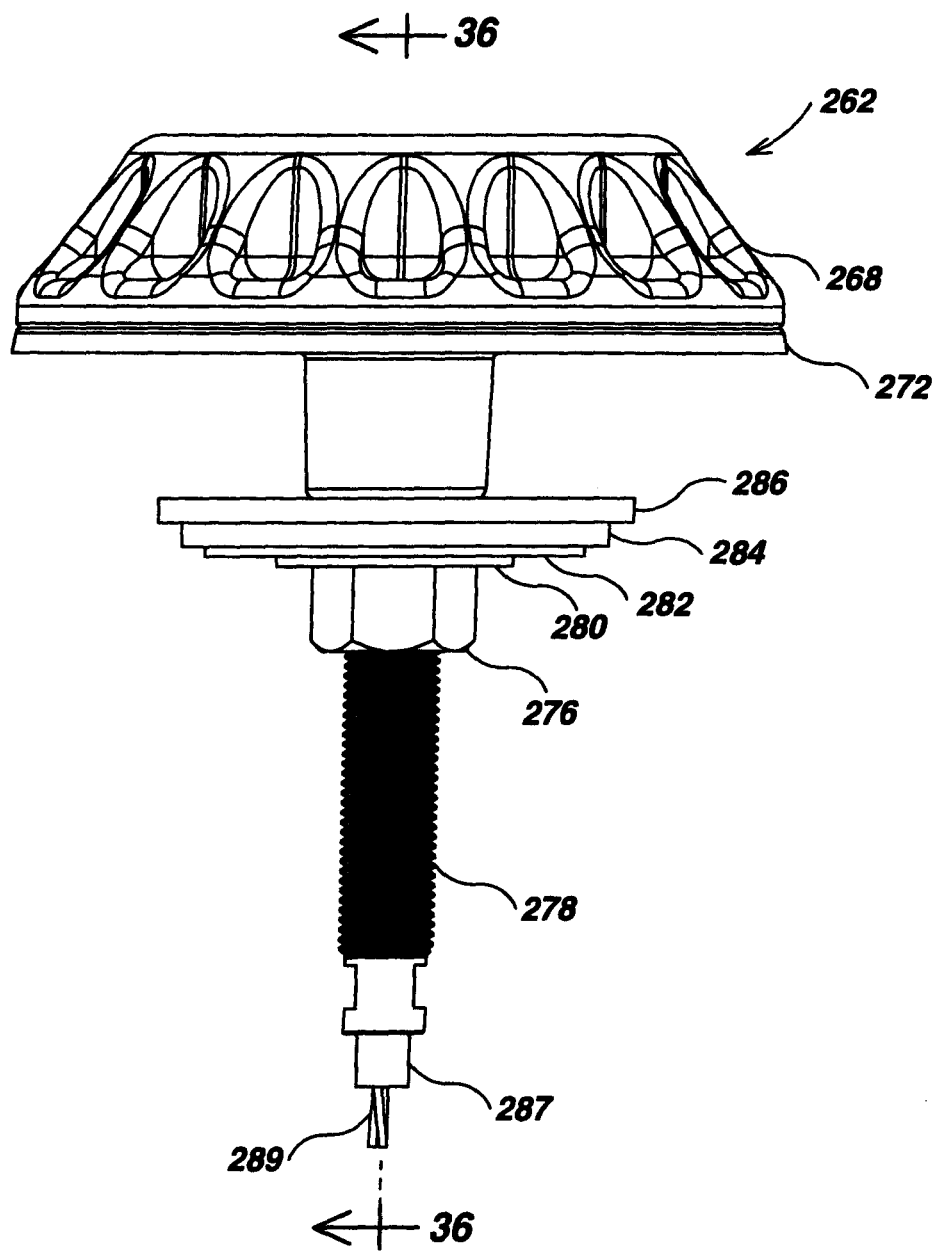
FIG. 34 is a side elevation view of the thru-hull light of FIG. 33.
Figure 35:
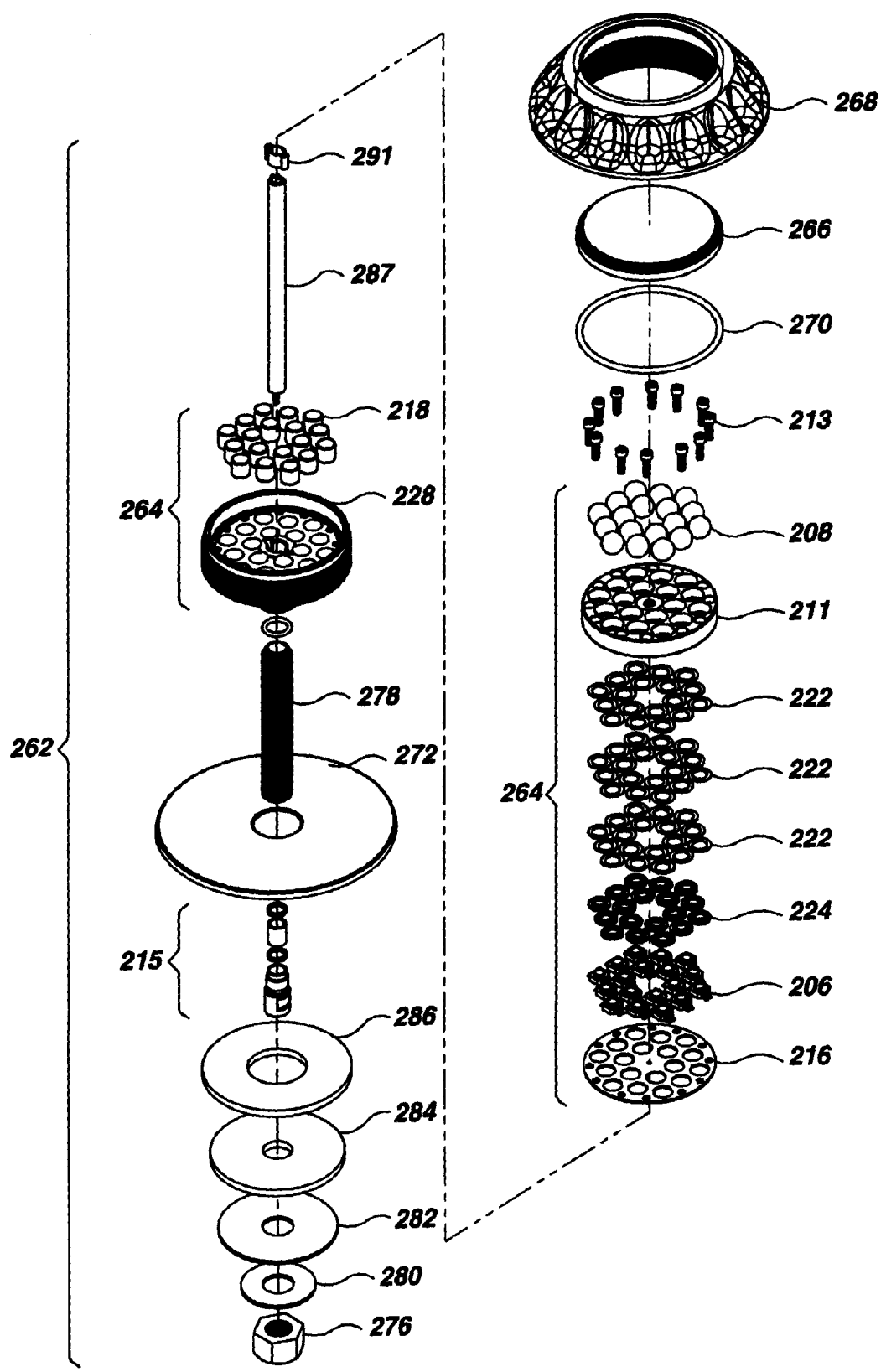
FIG. 35 is an exploded isometric view of the thru-hull light of FIG. 33.
Figure 36:
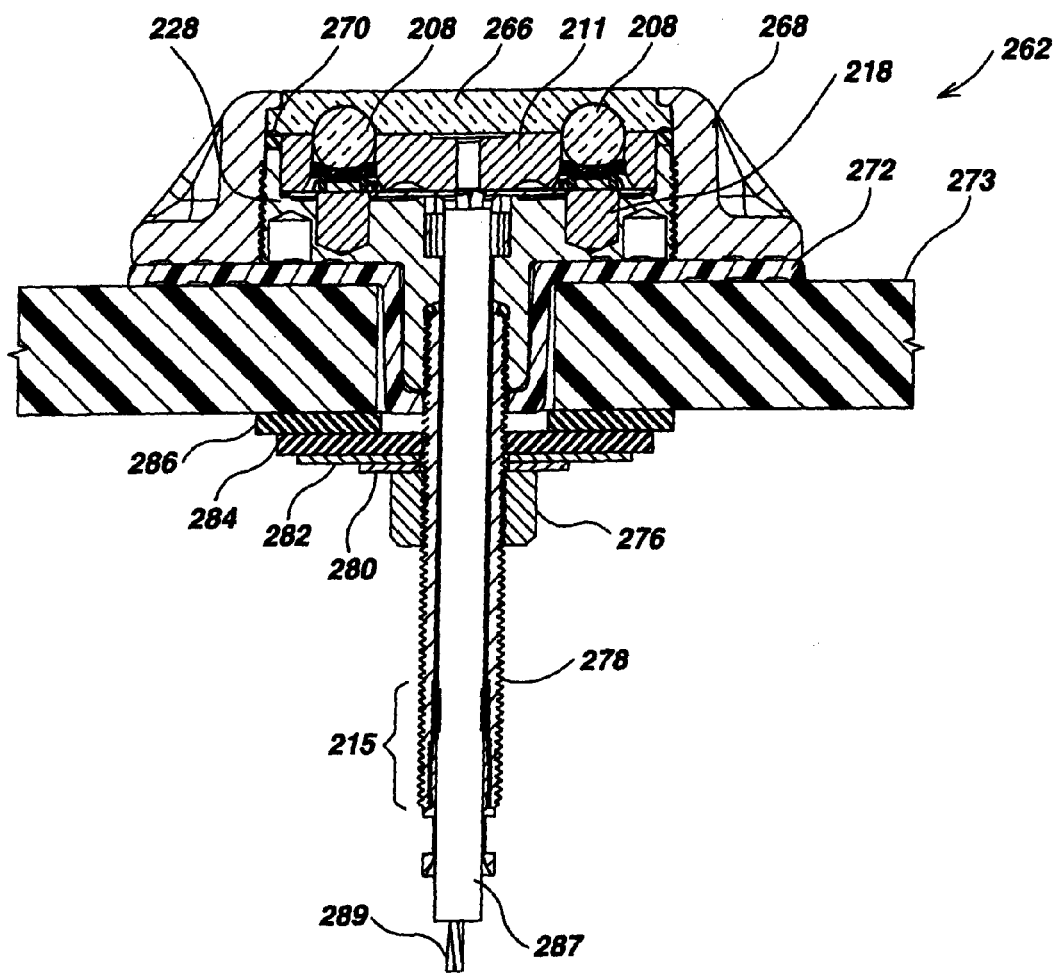
FIG. 36 is a vertical section view of the thru-hull light of FIG. 33, taken along line 36-36 of FIG. 34.
Figure 37:
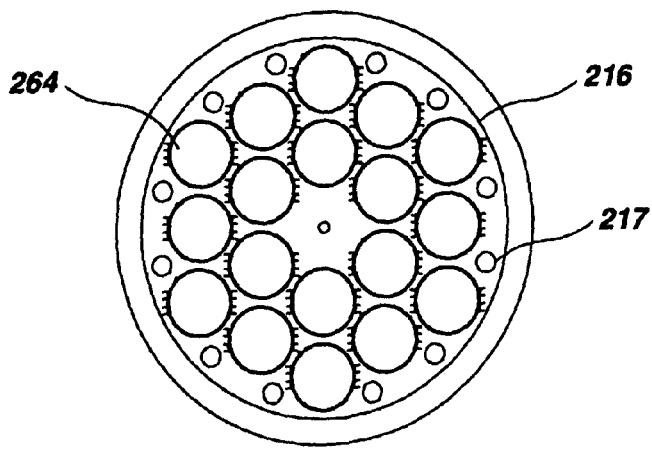
FIG. 37 is a top plan view illustrating the arrangement of LED light assemblies within the thru-hull light of FIG. 33.

FIGS. 33-37 illustrate a thru-hull light assembly 262 utilizing various concepts previously described. A plurality of LED assemblies 264 (FIG. 37) are mounted behind a transparent window 266 (FIGS. 33 and 36). Each of the LED assemblies 264 is constructed in accordance with embodiment 226 of FIGS. 26 and 27. The LED assemblies 264 are mounted within a generally cylindrical housing 228 (FIGS. 35 and 36). The window 266 is sealed to the housing 228 via O-ring 270. Housing 228 and window 266 are mounted inside and held by flange ring 268. Housing 228 is in turn supported on threaded shaft 278 for external mounting on the hull 273 of the vessel. A central drum of the housing 228, as well as threaded shaft 278, passes through a small hole in the hull of the vessel. A nut 276 can be tightened on a threaded shaft 278 to press washers 280, 282, 284 and 286 against the inside surface of the vessel hull. The threaded shaft 278 is forced through the small hole in the vessel hull to press hull insulator 272 (FIGS. 34-36) against the external surface and the small hole in the vessel hull. The hull insulator 272 serves to both thermally and electrically isolate light assembly 262 from the vessel hull. The threaded shaft 278 is sealed into the drum on cylindrical housing 228 and provides a water-tight pathway for electrical conductors 289 that supply power to the LED assemblies 264. Screws 213 (FIG. 35) hold plate 211 against housing 228.

The thru-hull illumination device 262 (FIGS. 33-37) has the advantage of being low profile, permitting it to be mounted to the outside surface of the vessel hull without creating undo drag. The LED assemblies 264 provide substantial underwater lighting for purposes of photography, observing submerged obstacles, attracting fish, aesthetic qualities and so forth. The LED assemblies 264 may produce all white light, or they may be red, green and blue, which, in various combinations of energization, can produce a beam of light of a desired color.

Figure 38:
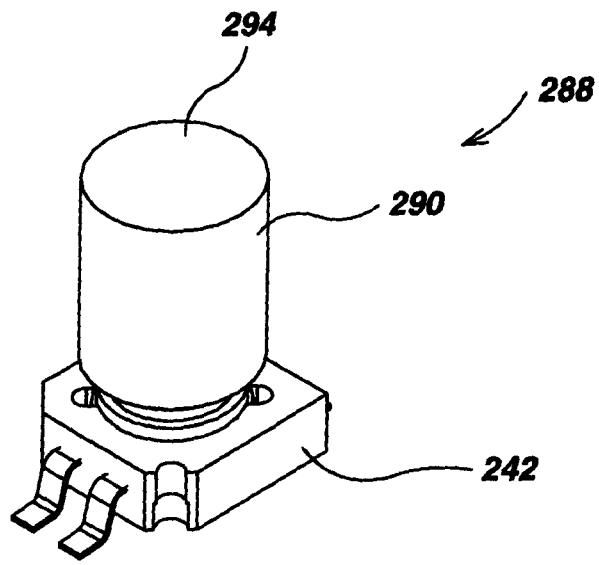
FIG. 38 is an isometric view of another embodiment of the present invention that utilizes a rod lens element.
Figure 39:
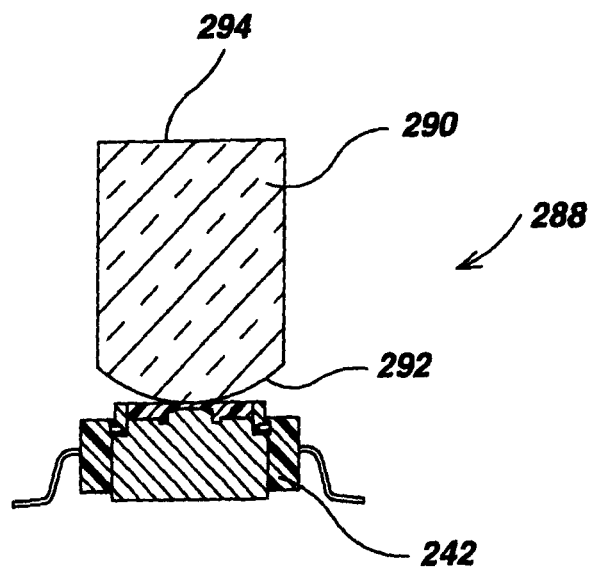
FIG. 39 is a vertical section view through the embodiment of FIG. 38.

FIGS. 38 and 39 illustrate a preferred embodiment of an LED illumination device 288 which is similar to the embodiment 202 of FIG. 25, except that in the former a rod lens element 290 is used in place of the spherical lens element 208. The rod lens element 290 has a curved lower surface 292 (FIG. 39) which gathers light from the LED device 242. The rod lens element 290 has a flat upper surface 294.

Figure 40:
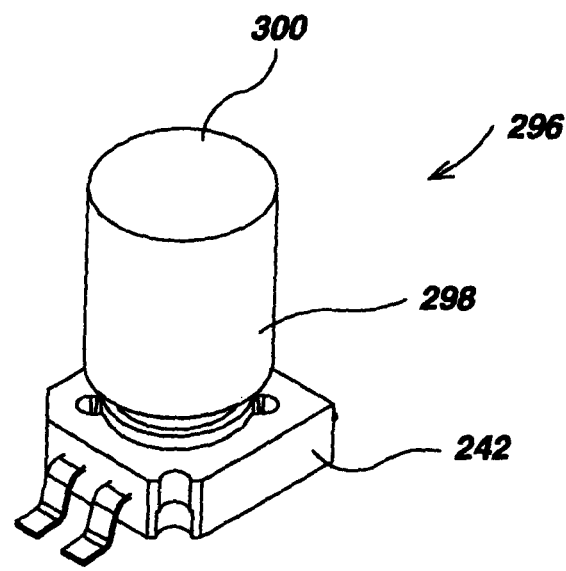
FIG. 40 is an isometric view of another embodiment of the present invention that utilizes a rod lens element with rounded upper and lower ends.
Figure 41:
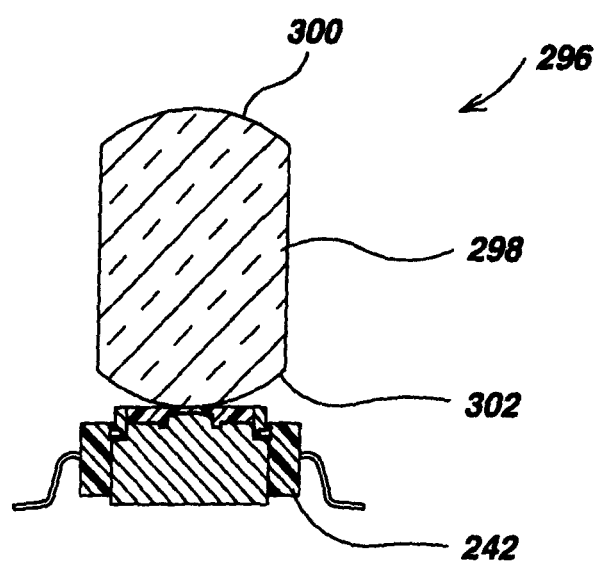
FIG. 41 is a vertical section view through the embodiment of FIG. 40.

Referring to FIGS. 40 and 41, another embodiment of an illuminating device 296 is similar to the embodiment 288 of FIGS. 38 and 39, except that the former utilizes a rod lens element 298 with curved upper and lower surfaces 300 and 302.

While various embodiments of improved LED illumination devices have been described in detail, it will be apparent to those skilled in the art that the invention can be modified in both arrangement and detail. For example, the lens element that directly gathers light from the high intensity LED 204 can have varying shapes and configurations; however, preferably the underside surface is round, ellipsoid, parabolic or some other curved surface for gathering the light. As another example, the embodiments of FIGS. 1-12 and 15-22 could have optical elements adjacent the LEDs that are made of Sapphire, Cubic Zirconia, Zircon or SF8 optical glass. The heat sinks that extend through the apertures in the PCB substrate can be made by any known means. For example, rather than being pressed into place, these can be raised machined or formed features in a solid metal plate. TIR in a Cubic Zirconia spherical lens or ball can be reduced or eliminated by coating the surfaces with a material with an index of refraction intermediate between, for example, air with an index of refraction of 1.0 and the Cubic Zirconia at 2.17. E-Beam Quartz is an example of such a coating. LUXEON K2 LEDs are available in green, cyan blue and royal blue colors. Various proportions of each color may be used to maximize the attraction of marine life. Therefore, the protection afforded the invention should only be limited in accordance with the following claims and their equivalents.

I claim:
1. An LED illumination device, comprising:
  a light emitting diode (LED);
  a generally curved lens having a flat surface positioned adjacent to a light emitting surface face of the LED; wherein the lens has an index of refraction relative to a light wavelength emitted by the LED of greater than about 1.65;
  a thermal cup comprising a hollow post;

a circuit board comprising a hole, wherein the hole is disposed to receive the hollow post, wherein the circuit board is configured to move along an axis that is parallel to a surface of the circuit board;

a spring disposed around the hollow post; and a wire, wherein a first end of the wire is connected to the light emitting diode, wherein a second end of the wire is connected to the circuit board, and wherein the wire passes through the hollow portion of the hollow post.

2. The illumination device of claim 1, further comprising: a thermally conductive fluid disposed in a channel, wherein at least a portion of the thermally conductive fluid is in contact with at least a portion of the hemispherical lens.

3. The illumination device of claim 1, wherein one or more outer surfaces of the hemispherical shaped lens comprise a curved surface and the flat surface, and wherein the flat surface of the hemispherical shaped lens is in contact with the light emitting surface face of the light emitting diode.

4. The illumination device of claim 1, wherein the flat surface of the hemispherical shaped lens is positioned within a predetermined distance from the light emitting surface face of the light emitting diode, the predetermined distance being less than or equal to a diameter of the hemispherical shaped lens.

5. The illumination device of claim 1, further comprising an intervening optically transparent material comprising one or more of fluid, grease, gel, and elastomer having an index of refraction of less than about 1.50, the material filling a space between the flat surface of the hemispherical lens and the light emitting surface face of the light emitting diode.

6. The illumination device of claim 1, further comprising:

an acrylic window positioned adjacent to the hemispherical shaped lens;

an intervening optically transparent material, the intervening optically transparent material filling a space between at least a portion of a curved surface of the hemispherical shaped lens and the acrylic window, wherein the acrylic window has an index of refraction greater than about 1.20.

7. The illumination device of claim 1, wherein the generally hemispherical shaped lens has a diameter greater than three times the longest dimension of the light emitting surface face of the light emitting diode.

8. The illumination device of claim 1, wherein the generally hemispherical shaped lens comprises a cubic zirconia material.

9. The illumination device of claim 1, wherein the generally hemispherical shaped lens comprises a sapphire material.

10. The illumination device of claim 1, further comprising a heat sink thermally coupled to a heat conduction surface of the LED.

* * * * *